United States Patent
Jackson

(10) Patent No.: US 8,197,603 B2
(45) Date of Patent: Jun. 12, 2012

(54) METHOD AND APPARATUS FOR TREATING A SUBSTRATE WITH DENSE FLUID AND PLASMA

(76) Inventor: David P. Jackson, Saugus, CA (US)

(*) Notice: Subject to any disclaimer, the term of this patent is extended or adjusted under 35 U.S.C. 154(b) by 1273 days.

(21) Appl. No.: 11/465,775

(22) Filed: Aug. 18, 2006

(65) Prior Publication Data

US 2006/0278254 A1 Dec. 14, 2006

Related U.S. Application Data

(62) Division of application No. 10/393,872, filed on Mar. 21, 2003, now abandoned.

(60) Provisional application No. 60/365,788, filed on Mar. 21, 2002.

(51) Int. Cl.
*B08B 7/04* (2006.01)
*B08B 7/00* (2006.01)

(52) U.S. Cl. ............... 134/1.2; 134/1; 134/1.1; 134/26; 134/30

(58) Field of Classification Search ............... 134/1, 1.1, 134/1.2, 26, 30
See application file for complete search history.

(56) References Cited

U.S. PATENT DOCUMENTS

| | | | |
|---|---|---|---|
| 4,911,761 A | 3/1990 | McConnell et al. | |
| 5,013,366 A | 5/1991 | Jackson et al. | |
| 5,054,421 A | 10/1991 | Ito et al. | |
| 5,326,406 A | 7/1994 | Kaneko et al. | |
| 5,368,171 A | 11/1994 | Jackson | |
| 5,403,621 A | 4/1995 | Jackson et al. | |
| 5,782,253 A | 7/1998 | Cates et al. | |
| 5,868,862 A | 2/1999 | Douglas et al. | |
| 5,908,510 A | 6/1999 | McCullough et al. | |
| 5,967,156 A | 10/1999 | Rose et al. | |
| 6,057,414 A | 5/2000 | Razavi | |
| 6,180,031 B1 | 1/2001 | Bawa et al. | |
| 6,194,036 B1 | 2/2001 | Babayan et al. | |
| 6,228,563 B1 | 5/2001 | Starov et al. | |
| 6,240,936 B1 | 6/2001 | DeSimone et al. | |
| 6,242,165 B1 | 6/2001 | Vaartstra | |
| 6,503,366 B2 | 1/2003 | Penelon et al. | |
| 6,848,458 B1 | 2/2005 | Shrinivasan et al. | |
| 6,955,177 B1 * | 10/2005 | Chiu et al. | .......... 134/1.2 |
| 2002/0134403 A1 | 9/2002 | Selwyn et al. | |

FOREIGN PATENT DOCUMENTS

| | | |
|---|---|---|
| DE | 199 03 243 A1 | 8/2000 |
| EP | 0 391 035 | 10/1990 |

OTHER PUBLICATIONS

EPO translation of the description of DE 19903243.*

* cited by examiner

*Primary Examiner* — Alexander Markoff

(57) ABSTRACT

The present invention is a method, process and apparatus for selective cleaning, drying, and modifying substrate surfaces and depositing thin films thereon using a dense phase gas solvent and admixtures within a first created supercritical fluid anti-solvent. Dense fluids are used in combination with sub-atmospheric, atmospheric and super-atmospheric plasma adjuncts (cold and thermal plasmas) to enhance substrate surface cleaning, modification, precision drying and deposition processes herein. Moreover, conventional wet cleaning agents such as hydrofluoric acid and ammonium fluoride may be used with the present invention to perform substrate pre-treatments prior to precision drying and cleaning treatments described herein. Finally, dense fluid such as solid phase carbon dioxide and argon may be used as a follow-on treatment or in combination with plasmas to further treat a substrate surface.

10 Claims, 19 Drawing Sheets

METHOD AND APPARATUS FOR TREATING A SUBSTRATE WITH DENSE FLUID AND PLASMA

CROSS-REFERENCE TO RELATED APPLICATION(S)

This application is a Divisional of U.S. patent application Ser. No. 10/393,872 entitled PRECISION SURFACE TREATMENTS USING DENSE FLUIDS AND A PLASMA filed on 21 Mar. 2003 now abandoned which claimed the benefit of similarly titled Provisional Application No. 60/365,788, filed on 21 Mar. 2002, each of which are hereby incorporated herein by reference.

BACKGROUND OF INVENTION

Smaller electronic, optical and micromechanical devices, with nano-scale device manufacturing already on the horizon, are driving the need for improved cleaning and drying technology. Smaller circuits and surface features are becoming increasingly affected by smaller surface particles and other residues (contaminations) during manufacturing operations. Moreover, many conventional wet cleaning techniques are not compatible with the shrinking device geometries and new manufacturing materials. Still moreover, the transition to larger wafer substrates such as the 300 mm platform is driving the need for increased performance and productivity in cleaning and drying processes and tools. Precision cleaning and drying are common and often repeated process steps performed prior to or following almost every other non-cleaning step of wafer manufacturing, for example photoresist deposition, curing, acid etching, plasma etching and patterning. As such, a present need exists for novel substrate dry cleaning and drying technology, as well as the capability of integrating new dry cleaning and drying technology with the aforementioned conventional wafer manufacturing processes, wet or dry, to provide a more efficient and integrated wafer processing tool.

Much interest exists to develop alternative wafer cleaning, drying and photoresist deposition methods to replace hazardous cleaning and drying chemicals such as alcohols, hydroxylamines, and organic solvents, or to produce surfaces, films or coatings with increased quality, planarity and thinness. The presence of organic contaminants or particles on a substrate surface with thicknesses on the order of 0.1 microns or greater generate considerable cleaning difficulties. Often it is necessary to remove all gross contamination first by solvent immersion cleaning before applying precision spray cleaning procedures. In another example, vacuum plasma cleaning using argon-oxygen or fluorine chemistry is used to treat a layer of patterned photoresist. Often this procedure leaves behind trace amounts of recalcitrant reactive ion etched (RIE) polymeric residues comprising a mixture of metals, carbon and fluorine. A second precision cleaning step using acids, alkalies, peroxides, ozonated water, or hydroxylamine chemistries, followed by deionized water rinses and alcohol drying are required to produce precision clean and dry surfaces.

The trend towards miniaturization of silicon, germanium and gallium arsenide microprocessors in the electronics industry and the emergence of new micro-electromechanical systems (MEMS) manufacturing, which uses much the same microprocessor manufacturing technology, is creating new material and process challenges. Conventional cleaning, drying, etching, and deposition technologies are being pushed to their limits as contamination removal issues become more important with each new device generation. For example, the smaller dimensions create new cleaning challenges due to increasing capillary force pressures which hold process fluids within cavities, more prevalent electrostatic forces which hold micromechanical structures together, porous or complex surface topography which preclude the use of aqueous chemistries, and high aspect ratio cavities and vias which hide etch residues and particles, among others. Moreover, new materials such as low-k films and copper lines used to fabricate smaller device geometries (line widths) are not compatible with many conventional wet processing techniques described above.

For example, surface micromachining of poly-silicon films deposited on silicon wafers is an emerging technology in the fabrication of micro-actuators and micro-sensors. These miniaturized components include micro-engines, micro-lever actuators, accelerometers, optical switches, biomedical sensors, and pressure sensors which have potential uses in a variety of applications for mechanical and electrical devices both in industry and in government.

Similar to integrated circuits (IC) fabrication, surface machined microstructures are formed using a combination of masking, dry plasma etching of poly-silicon film deposited on the wafer, and wet etching done in a liquid-phase acid solution such as hydrofluoric acid (HF). A final HF etch is followed by a water rinse. In some cases the HF etch is followed by an ammonium fluoride ($NH_4F$) treatment. After etching with acid and rinsing with deionized water, the part is dried, for example using evaporative methyl alcohol drying, to yield the released micromachined sample.

Silicon is a very practical micromechanical material in that it is capable of a great amount of flexibility before fracturing. However, the compliant nature of the silicon makes it susceptible to fabrication problems. A significant problem in the fabrication of the micromachined components is sticking of released structures to the substrate after they are dried using conventional air drying techniques. The sticking, combined with static friction which these parts experience has been termed stiction, a phenomenon commonly seen in magnetic storage media. A number of phenomena may potentially cause microdynamic stiction of suspended microstructures, several of which will be identified here. Electrostatic forces due to electrostatic charging may cause sticking. These forces can be generated on the wafer due to etching, rinsing and drying operations. This is a non-equilibrium condition which usually dissipates over time or with contact between conducting surfaces. Second, a smooth surface finish may cause stiction. Smooth surfaces are more likely to stick, while surface roughness effectively increases the nominal separation between micromachined surfaces. Third, a phenomenon called solid bridging occurs when non-volatile impurities present in the drying liquid are deposited on the surfaces of the microstructures. The impurities in narrow gaps formed by the suspended microstructures essentially bridge the gaps, causing the structures to stick. Obviously, avoiding impurities in the liquid cleaning and drying fluids will minimize solid bridging.

Perhaps the most troublesome cause of surface stiction is liquid bridging. Liquid bridging is due to the surface tension effects of trapped capillary liquids upon drying. The liquid, usually water, used to rinse the microstructures is trapped in the narrow gaps between the silicon wafer and the suspended structures. Interfacial forces generated when the trapped capillary fluid dries can cause the microstructures to collapse and stick. Moreover, conventional thermal or solvent drying of silicon IC structures such as microvias cause the cavity walls to crack as the sidewalls are pulled together during extraction or evaporation of water or high surface tension drying solvents such as methyl alcohol.

The meniscus force (Fm) between two flat, polished surfaces (or wafer microvia sidewalls) with a liquid bridge is given by LaPlace's law and is calculated using the following equation;

$$Fm=(\gamma A/h)(\cos \phi_1+\cos \phi_2), \text{ where;}$$

$\phi_1$—contact angles of the liquid with the surface 1;
$\phi_2$—contact angles of the liquid with the surface 2;
A—shared surface area of the two parallel surfaces, assuming the gap between them is flooded with capillary liquid;
h—average thickness of the liquid bridge;
$\gamma$—surface tension, 73 dynes/cm for water at 25 C.

If a liquid such as water is present in small capillaries during the drying process, the surface tension exerts tremendous pressure on the sidewalls. This stress can be high enough to cause smoothe flat interfaces to stick, or in the case of IC fabrication, microvia sidewalls to collapse. Thus it is very beneficial to reduce or eliminate surface tension to lessen or eliminate surface stiction due to liquid bridging and prevent sidewall collapse of very small trenches during drying.

Supercritical carbon dioxide ($SCCO_2$) extraction has been demonstrated to remove capillary liquids (e.g. methanol) from micromachined structures, eliminating sticking caused by surface tension effects. Carbon dioxide has long been known to be a good solvent for many organic compounds and methanol, in particular, is known to be very soluble in $SCCO_2$. A conventional wafer drying process using carbon dioxide has been to displace the rinse water first with methyl alcohol, and then to dissolve the methanol with liquid or supercritical carbon dioxide. If extremely small capillaries are present, the process may be performed above the critical temperature of methanol, which can be over 200 C, to insure that the interfacial surface tension of the drying and extraction fluids within these small capillaries is approximately 0 dynes/cm. After the methanol has been dissolved and carried away by the supercritical fluid, the vessel is depressurized to yield dry, released microstructures or dry vias and trenches. Surface tension effects are eliminated since $SCCO_2$ has negligible surface tension like a gas. Furthermore, $SCCO_2$ exhibits gas-like properties of diffusivity and viscosity which allow the supercritical fluid to access narrow gaps under the microfeatures for removal of trapped capillary fluid. Other commercial uses of dense fluids for drying include the extraction of solvents from phase-separated polymer gels to produce microcellular foams and the extraction of solvents from silica aerogels. Also, researchers at the University of California at Berkeley have removed drying solvent from micromachined samples using liquid carbon dioxide which requires the additional step of increasing to supercritical conditions before depressurizing to avoid the sticking problems caused by a liquid/vapor interface.

The most significant drawbacks with the aforementioned conventional dense fluid drying techniques are very long process cycle times and the use of excessive amounts of supercritical or liquid carbon dioxide in completely flooded pressure vessels to remove only trace amounts of surface contamination (i.e., water and drying solvents). Another drawback is that these drying methods do not effectively remove small particles and in fact can easily re-contaminate substrates which are completely bathed in the reactor fluid. Moreover, these methods are not effective or selective for removing other liquid contaminations present on the substrate surface or trapped within pores of substrates. Still moreover, solid contaminants such as carbon residues are not effectively removed using these conventional techniques, even when modified with organic solvents. Most often extreme pressures are required to achieve separation.

Water, solid particles and residues (contaminations) must be removed from critical surfaces. If left on critical surfaces, these may bridge circuits, obscure light or produce other deleterious side-effects which reduce yields, that is clean dry surfaces for subsequent processing steps. For example, surface residues, particles and liquids such as water must be removed prior to placement or in-situ formation of thin coatings such as low k dielectrics, or patterning, in preparation for subsequent lithographic processes. Moreover, processes described above such as cleaning, etching, drying and application of coatings are most often performed as separate operations, which greatly increases the risk of device contamination during manufacture.

With respect to cleaning wafers to remove trace organic and particle contamination, commercial wet and dry cleaning systems have been developed which employ ozone and water to replace dangerous or ecologically-unsafe chemical processes such as sulfuric acid-hydrogen peroxide mixtures, toxic organic solvents, and amine-based cleaning agents. One such system, called the SMS DIO3 photoresist strip process (Legacy Systems Inc., Fremont, Calif.), uses an ozone generator and diffuser located in a tank of chilled (5 C) deionized water which is circulated into a tank containing the wafers. This system suffers from an inability to apply thermal energy to the substrate because it lowers the solubility of ozone in solution and is essentially time-dependent and concentration-dependent solid-ozone gas interfacial reaction. Another commercialized process, called HydrOzone (trademark of Semitool Inc.), diffuses ozone gas through a thin film of heated water which is spreading over a spinning wafer. The HydrOzone process is claimed to be more efficient than the DIO3 process above because the water component may be heated to provide thermal cleaning energy and RPM may be varied to control boundary layer thickness. However, similar to the DIO3 process, transport of ozone of any significant concentration into micron features on the wafer surface is very limited due to the solid-ozone gas interface. Moreover excessive agitation caused by rapid movement of water over the spinning wafer accelerates the decomposition of the ozone gas as it diffuses through the thin film boundary. Moreover, complete drying of the substrate following cleaning by both methods is also limited due to hydration of small capillaries, vias and interstices present on the wafer. Finally, a lack of solvent selectivity can be limiting in many resist removal applications. Commercial cleaning of textiles using ozonated water is also known. Ozone acting as a cleaning agent additive is used to destroy soils contained on fabrics. This method is similar to ozonated water treatment of wafer and suffers from the same solubility and selectivity problems.

Following these ozonated processes, a technique often used to rinse wafers is the "quick dump" method. The quick dump method relies upon the rapid deployment of water from the rinse tank to remove water and impurities from the semiconductor wafer. A limitation with this method is its inability to actually remove particles from the wafer. In fact, the rapid deployment of water from the tank often transfers more particles onto the wafer. In addition, the wafers from the quick dump tank must still undergo a drying operation, further increasing the number of particles on the wafer. As previously noted, an increase in particles on a surface often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step removes water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to problems such as greater downtime, wafer breakage, more spare parts, and increased cost of ownership, among other issues. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. An example of such a technique is described in U.S. Pat. No. 4,911,761, issued to McConnell et al., which generally suggests the use of a superheated or saturated drying vapor as a drying fluid. This superheated or saturated drying vapor often requires the use of large quantities of a hot volatile organic material. The superheated or saturated drying vapor forms a thick organic vapor layer overlying the rinse water to displace (e.g., plug flow) such rinse water with the drying vapor. The thick vapor layer forms an azeotropic mixture with water, which will condense on wafer surfaces, and will then evaporate to dry the wafer.

A limitation with this type of dryer is its use of the large solvent quantity, which is hot, highly flammable, and extremely hazardous to health and the environment. Another limitation with such a dryer is its cost, which is often quite expensive. In fact, this dryer needs a vaporizer and condenser to handle the large quantities of hot volatile organic material.

Still another technique relies upon a hot deionized (DI) process water to rinse and promote drying of the semiconductor wafer. By way of the hot DI water, the liquid on the wafer evaporates faster and more efficiently than standard room temperature DI water. However, hot water often produces stains on the wafer, and also promotes build-up of bacterial and other particles.

U.S. Pat. No. 6,240,936, issued to DeSimone et al., suggests a method for applying liquid carbon dioxide onto a portion of spinning substrate to clean and deposit solutes contained within the liquid carbon dioxide spray agent in a carbon dioxide atmosphere. The '936 patent suggests using inert gases with liquid carbon dioxide and a pool of liquid carbon dioxide within the process chamber, both methods being taught to maintain a differential pressure for selectively evaporating the liquid carbon dioxide from the substrate surface. However, the '936 patent does not teach first establishing an inert supercritical fluid atmosphere into which a liquefied gas or supercritical fluid such as carbon dioxide may be much more selectively applied and controlled. Methods as suggested by the '936 patent suffer from an inability to fully exploit the delivery agent (dense fluid) chemistry, as the liquid-state carbon dioxide chemistry is not a variable geometry dense fluid. The application temperature must be maintained below 30 C to maintain liquid phase and solvent power. This is a significant disadvantage as elevated temperatures improve spray cleaning performance, lowering particle adhesion and increasing contaminant solubility, and increases the solubility of high molecular weight polymers such as photoresist resins. For example, the liquid phase carbon dioxide surface tension, density and viscosity in the '936 patent cannot be varied to any significant degree, which prevents optimization of solute chemistry and substrate cleaning and deposition processes. Moreover, the substrate is contained in the saturated dense fluid vapor atmosphere which requires large quantities of dense fluid and extra processing steps to remove. Still moreover, it has been the experience of the present inventor using the exemplary commercial SuperFuge cleaning system described above that using liquid carbon dioxide cleaning solvent at a pressure and temperature on the vapor-liquid equilibrium boundary produces an inferior surface cleanliness to liquid carbon dioxide compressed above its liquid-vapor boundary. However, to achieve this later state the entire pressure vessel—substrates, baskets, pressure walls, centrifuge assembly—must be in liquid phase. Using this method, most of the cleaning fluid is wasted and cross contamination problems arise.

By contrast, the present invention provides a means for producing variable geometry supersaturated liquids (liquids compressed above their normal liquid-vapor pressure-temperature boundaries) and supercritical fluids which are selectively contacted with a substrate surface. Using an anti-solvent atmosphere to first to create the proper temperature-pressure conditions within which a much small quantity of dense fluid is selectively introduced, used, and captured. The present invention is more selective, uses less reagent (dense fluids), and the techniques taught herein extend themselves to cleaning, surface modification and deposition processes.

In contrast to the '936 patent, the present invention teaches selectively applying preferably a supercritical fluid, but a liquefied gas may be applied, which may contain one or more substances, to a substrate surface which is either colder or hotter than the applied dense fluid. The substrate is made warmer or colder than the dense fluid using an inert supercritical fluid anti-solvent atmosphere which first bathes the substrate before selective application of the dense fluid. Still moreover, and in contrast again to the '936 patent, the substrate and reactor temperature of the present invention is controlled much more precisely during depressurization processes. This is accomplished because the joule-thompson (J-T) coefficient of the supercritical atmosphere is much lower than the J-T coefficient of the dense fluids, the volumetric ratio of supercritical atmosphere to dense fluids is very large, and the extraction of dense fluids during processing is performed in such a manner as to prevent excessive amounts of dense fluid from 'boiling off' on substrate surfaces.

U.S. Pat. No. 5,908,510, issued to McCullough et al., suggests a method for residue removal from etched wafers using supercritical or liquefied carbon dioxide, followed by a jet spray of solid cryogenic particles. The '510 patent suggests using surfactants and additives under a contact time of between 30 minutes to 2 hours to remove CFx residues from vias and trenches using stirred fluid at about 500 to 2500 rpm. The additives are water and a fluorinated surfactant. As discussed above in regard to the '936 patent, the '510 patent suffers from lack of selectivity, with the entire substrate processed in essentially carbon dioxide. The '510 patent does not teach creating reactive cleaning agents in-situ nor selectively applying said instantaneous cleaning agents to contaminated surfaces to achieve a desired substrate surface cleanliness in a much more rapid period of time. Moreover, in contrast with the '510 patent, the present invention is a much more effective surface cleaning (i.e., particles, residues) technique called condensation shear surface cleaning which itself is greatly enhanced using supercritical plasma techniques described herein.

U.S. Pat. No. 5,013,366, issued to Jackson et al., suggests stepping the temperature between the liquid state and supercritical state in a series of steps. The entire substrate is bathed in a dense fluid environment which is then changed physicochemically by changing the chemistry of the bulk fluid in a series of steps over time using bulk fluid temperature changes from above and below the critical temperature of the dense fluid. The process of the '366 patent is inefficient because it changes the properties of an entire fluid environment to process a substrate surface. Also the '366 patent will not remove small surface particles because it does not produce sufficient shear stress energy during the phase transition. By contrast, the present invention uses a much smaller fraction of dense fluid which is selectively applied to a substrate surface and is changed from supercritical fluid phase to liquid phase, or vice versa, in a single sweeping and radial step, and preferably in a pulsed application while traversing the surface of a substrate surface—producing both shear stress and a change in chemistry. As such and by contrast, the object of the present invention is to provide a shearing action across the surface of a substrate, as well as change the viscosity, cohesive energy and density of the fluid while it traverses from the center to the perimeter of a planar substrate.

U.S. Pat. No. 5,403,621, issued to Jackson et al., suggests non-selective deposition process of coating an entire substrate surface by stepping the temperature between the liquid state and supercritical state to cause a coating to drop out of solution. The entire substrate is bathed in a dense fluid environment which is then changed physicochemically by changing the chemistry of the bulk fluid in a series of steps over time using bulk fluid temperature changes from above and below the critical temperature of the dense fluid. The process of the '366 patent is inefficient because it changes the properties of an entire fluid environment to process a substrate surface, causing the coating to coat all surfaces of the reactor and substrate simultaneously. By contrast, the object of the present invention is to provide a selective method for producing varying thickness of a coating over a portion of a substrate surface while a dense fluid mixture traverses from the center to the perimeter of a planar substrate.

In all of the cited prior art, none suggests the use of a condensation shear cleaning technique whereby a condensable solvent phase is selectively contacted with a substrate surface or portion thereof to cause the solvent phase to "locally" condense due to heat exchange with the substrate surface, while the substrate is dynamic or static. Moreover, the prior art does not propose the novel and beneficial aspects of combining plasmas with dense fluids.

Another novel and beneficial aspect of the present invention is that a supercritical fluid anti-solvent such as nitrogen or argon provides enough vapor pressure to essentially condense and contain most of the carbon dioxide compound as a liquid in a hemisphere which is below the substrate. This allows for easy recovery and reuse of most of the carbon dioxide through headspace compression and minimizes joule-thompson cooling of the substrate being treated during post-processing depressurization operations. Because of a comparatively small ratio of dense fluid-to-supercritical atmosphere (i.e., approx. 5 parts in 100) a small quality of condensed dense fluid (liquid) is continuously discharged from the bottom of the process chamber and only inert supercritical atmosphere, having a much lower joule-thompson coefficient than the dense fluid cleaning/deposition agent, remains following each spray cleaning cycle.

An excellent description of a conventional coating process is the photoresist deposition process and is detailed in VLSI Fabrication Principles, Second Edition, Sorab K. Ghandi, summarized as follows. In a conventional process, a film of photoresist material is placed on a surface of the wafer which is covered by a masking film. It is desirable to have the photoresist film be very uniform, highly adherent, and completely free of fine particulate matter or pinholes. For example, a positive resist is applied using a suitable organic carrier solvent. A pre-filtered resist-solvent mixture is applied to the center point of a spinning wafer, whereupon the coating mixture spreads outward in all directions from the center to the perimeter of the wafer. The film thickness is inversely proportional to the square root of the spin rate; typically, spinning speeds range from 1000 to 6000 rpm and result in film thickness that ranges from 0.5 to 3.0 um. Consistent results are maintained only if the viscosity of the resist-solvent mixture is maintained on a run-to-run basis. Extreme care must be taken to clean and dry a wafer prior to photoresist deposition to prevent adhesion problems and incorporation of surface particles. Where surface adhesion is an issue due to, for example, the presence of certain functional groups, clean and dry wafers may be pre-wetted with a suitable organic coupling agent such as hexylmethyldisilizane (HMDS), trichlorophenylsilane, trichlorobenzene or xylene using a dipping or vapor-plating technique. Ultra-clean conditions must be maintained during the coating step to prevent the inclusion of atmospheric particles into the coating matrix, caused by air turbulence from the spinning wafer. The photoresist is sticky at this point and great care must be taken to prevent particle contamination. Following deposition, the coated wafer is soft-baked, preferably from below to remove excess organic solvent and vapors contained in the thin sticky film, without forming a "skin" on top. The bake temperature may be between 90 C to 100 C and causes the film to shrink to about 85% of its original thickness.

Following cleaning, coating and soft-bake procedures, the coated wafer is moved to a mask alignment, exposure with collimated UV light, post-bake, development, etching and stripping. Plasma cleaning processes are widely used to remove patterned photoresist, however radiation damage to MOS circuits can be a problem as well as an inability to remove carbon-fluorine sidewall contaminants produced by deep reactive ion etching (RIE) processes. These etch residues must be removed prior to repeating the coating, soft-bake and other lithographic processes described above. One aspect of the present invention teaches removing RIE residues from plasma treated substrates.

Following is a more detailed discussion of conventional substrate cleaning, preparation and coating techniques in relation to the present invention. This discussion will expose additional novel and beneficial aspects of the present invention.

High Pressure Solvent Spray Cleaning

Solvent spray cleaning provides an alternative process for removing particulate contaminants from flat surfaces. This technique effectively removes submicron particles proportionally with increasing spray pressures due to the production of high shear stress within the surface boundary layer where small particles hide out. To avoid recontamination of the surfaces, spray cleaning should be practiced in a closed environment or under a flow of clean inert atmosphere. Solvent spray cleaning techniques include high pressure alcohol and fluorocarbon solvent spray, steam sprays, dry ice pellet blasting and particle ice snow spray cleaning. These techniques are useful for cleaning 2-D surfaces only and cannot permeate of penetrate substrate pores, even at extremely high spray pressures due to access problems. However, techniques such as carbon dioxide snow cleaning, pellet cleaning, argon ice cleaning are excellent polishing techniques for removing sub-micron particles (particle cleans).

An aspect of the present invention is to optimize and control particle drag or shear stress as a means for cleaning and/or depositing a film on a planar substrate surface. Moreover, cohesion energy of the same fluid spray may be controlled to optimize penetration into a porous substrate surface to remove trapped contaminants therein. Another novel aspect of the present invention is to combine an atmospheric plasma process with a solid phase spray head to combine the benefits of atmospheric plasma cleaning with solid-phase dense fluid spray cleaning. A patented and patents-pending TIG-Snow carbon dioxide spray technique developed by the present inventor is used in an example final particle cleaning device and technique, however any dielectric spray technique described above such as argon ice, pellet carbon dioxide and liquid nitrogen cleaning will work with an atmospheric plasma to produce an ultraclean and particle free surface.

Plasma Cleaning

Plasma cleaning is a type of so called dry cleaning procedure which has the advantage of being able to clean large quantities of samples with little or no waste products and little operator input. It also has the distinct advantage of directly generating a clean, uniformly wettable and dry surface on the substrate. The cleaning may involve an argon-oxygen plasma to directly oxidize hydrocarbons, or an argon-only plasma to degrade them and desorb them. Such processes are suitable for cleaning surfaces and for activating polymer surfaces. The use of a plasma bears the distinct advantage of being able to penetrate inside complex structures. Generating plasma requires a specifically designed reactor. Generally, the specific gas to be used is injected to form an atmosphere at reduced pressure. Electromagnetic radiation (RF or microwave frequency) is then coupled into the enclosure, generating the plasma.

Some plasma systems operate at atmospheric pressure, removing the need for a vacuum-sealed enclosure. Plasma cleaning has an interesting feature, whereby its "effective" temperature (its $k_b T$ equivalent thermal energy) is of several thousand degrees. This is achieved by coupling energy into the gaseous phase without strongly increasing the substrate temperature. As an example, this process may clean carbon residue from surfaces without excessive heating. The plasma cleaning techniques also find application in the activation of other inorganic substrate surfaces such as metals and organic polymer surfaces.

A beneficial aspect of the present invention is that one or a combination of sub-atmospheric, atmospheric and super-atmospheric plasma-aided processes can be performed. This gives a range of beneficial plasma effects, for example producing supercritical ozone in high pressure plasmas produces a powerful in-situ cleaning agent.

Plasma is loosely defined as a partially or wholly ionized gas with a roughly equal number of positively and negatively charged particles. It has been dubbed the "fourth state" of matter with its properties being similar to those of a gas and liquid.

Various types of plasmas may be created depending upon pressure, temperature, gas type, and frequency, among other facors. Moreover, low and high temperature plasmas are formed using either a low pressure or high pressure, respectively. High temperature plasma is found at atmospheric or super-atmospheric pressures between 1 atm and 100 atm or more with the beneficial cleaning effect due primarily to high energy oxygen radicals or ozone. Low temperature plasmas, used for surface modification and thin film organic cleaning, are ionized gases generated at pressures between 0.1 and 2 torr. Low temperature plasmas work within a vacuum chamber where atmospheric gases have been evacuated typically below 0.1 torr. These low pressures allow for a relatively long free path of accelerated electrons and ions. Since the ions and neutral particles are at or near ambient temperatures and the long free path of the electrons, which are at high temperature or electron-volt levels, have relatively few collisions with molecules at this pressure the reaction remains at low temperature. By contrast, atmospheric plasmas of nitrogen, oxygen and carbon dioxide tend to dominated by reactive neutral species such as O atoms, metastable $O_2$, and some $O_3$. High pressure plasma reactions tend to be dominated by ozone or supercritical ozone. It has been suggested that atmospheric plasmas are more similar to low-pressure plasmas.

The ionization of the gases is accomplished by applying an energy field using one of two frequencies regulated by the federal government:

Radio frequency (RF) frequency—13.56 MHZ

Microwave (MW) frequency—2.45 GHz.

RF plasmas exhibit significantly higher levels of ultraviolet radiation (UV), which in part explains the higher concentrations of electronically charged particles than found in other plasma sources. RF plasmas have also been noted to be more homogeneous, a trait that is critical in treating irregularly shaped and overly large objects. MW source plasmas are generated downstream or in a secondary environment. Downstream is defined as the plasma generated in one chamber and drawn by a vacuum differential into the work area or another chamber. Though this can be advantageous for organic removal from ion sensitive components it also produces a less homogeneous process resulting in the compromising of uniformity across the work area. In surface modification the effective depth of the modification is tens of nanometers so the uniformity of the process becomes increasingly important, rendering MW source plasmas a less desirable choice. The voltage which must be exceeded to ignite a plasma is given by the following equation:

$$V_b = B(P \cdot d)/[\ln[A(P \cdot d)] - \ln[\ln(1 + 1/\gamma_{se})]]$$

where $V_b$—breakdown voltage,

P—pressure, d—gap distance, $\gamma_{se}$—secondary emission coefficient of the cathode, and A and B are constants found experimentally.

Also, the type of dielectric fluid influences $V_b$. When a plasma interacts with a substrate surface and contaminants thereon, four primary effects can occur:

1. Removal of organic materials;
2. Cross-linking via activated species of inert gases;
3. Ablation; and
4. Surface chemical restructuring.

A major problem that prevents adequate adhesion is the presence of organic contamination on the surface. Contamination may exist in the form of residues, mold release agents, anti-oxidants, carbon residues or other organic compounds. Oxygen plasma is excellent for removing organics and is commonly used for this purpose.

Oxygen plasma causes a chemical reaction with surface contaminants resulting in their volatilization and removal from the plasma chamber. Care must be taken in selection of cleaning process parameters to ensure that organics are completely removed. It is possible to "surface modify" the contamination instead of removing it and thus still have a barrier layer which will cause adhesion to fail. Critical parameters may include sufficient power density to remove but not polymerize the organics or the addition of other gases to facilitate the prevention of polymerization. When exposed to the RF energy field, oxygen ($O_2$) is broken down into free radicals at pressures above 0.1 torr is the most reactive element in the plasma and will readily combine with any organic hydrocarbon. The resultant combination is water vapor, CO and $CO_2$ which is carried away in the vacuum or fluid stream. The reaction is by its nature complete with no residual surface products, however non-organics such as salts are not so readily removed. Sufficient RF energy must be applied to produce a high plasma density. Lower power densities not only remove contamination at a slower rate but also can actually impede the removal process. While the top layers of organic are being removed with low power density, underlying layers may cross-link in three dimensions creating a stable but un-removed new structure.

When generating plasma using inert noble gases such as helium or argon, the plasma will break C—C or C—H bonds by ion and UV bombardment. These free radicals in turn recombine on the surface causing a stable cross-linking of the surface structure. The improved bond strength of the surface can be a very desirable effect. In the case of PTFE (Teflon) treatment, it has been found that pretreatment with helium followed by the plasma of ammonia ($NH_3$) will facilitate the bonding of a barrier layer to the PTFE, which in turn will be receptive to adhesion.

Etching of surfaces also can also be accomplished by plasma. Roughening of the surface can play a significant part in adhesion by increasing the total contact area between the adhesive and the subsurface. Etching is a result of gas selection or the length of time the surface is exposed to the plasma. Ablation can be accomplished with either active or inert gases and can be run to excess causing extremely porous surfaces by too long of an exposure to the plasma. The semiconductor manufacturing industry has used plasma etching as a primary treatment method for over 20 years. In addition the circuit board industry has used plasma as a means of etching polymers smeared in the drilling process. Hole smears prevent contact with plated through holes on multi-layer circuit boards. Smears are easily removed by plasma ablation regardless of how small the holes are.

Perhaps the plasma treatment effect offering the greatest potential is modification of the surface structure. By adding polar functional groups to the surface structure of the polymer we can greatly increase the surface energy and thus aid the adhesion to other substrate materials. Plasma treatment can be used to provide for the oxidation of the surface in much more uniform methods than by corona discharge or flame treatment. Large irregular surfaces also can be treated with little possibility of over-treatment, a drawback of both flame and corona methods. Elimination of adhesion primers or promoters, typically organic chemicals, is a benefit of using plasma prior to deposition of coatings.

Plasma reactions fall into two categories: chemical and mechanical. Chemical reactions result from a chemical interaction of the plasma with the surface of the product or contaminants attached to the surface. These reactions include oxidation and ablating the surface with such gases as oxygen, fluorine or chlorine. Mechanical reactions are generated with the use of noble gases such as argon or helium. Since these inert gases exist in their monatomic state the reaction is a kinetic energy transfer or, in simple terms a molecular scale sand blast. Dislodged contaminants can be swept away in the vacuum stream before they redeposit on the product or recombine on the product surface by selecting the proper process parameters. Inert gas plasma is also used to remove organic films and particulate matter from surfaces, which might readily oxidize such as silver or copper.

Conventional plasma systems have the following basic configuration:
1. A vacuum chamber for the reaction.
2. An energy source for gas ionization.
3. Control circuitry to regulate the time, gas flow and amount of energy.
4. A vacuum system to provide the low-pressure environment.

Chambers are manufactured in either metal or glass depending on the application and the method of ionization. Quartz chambers are used in highly critical environments where sub-micron particulate generation is an issue. This includes the semiconductor, hybrid and medical analysis industries. For industrial applications, metal chambers are more prevalent and allow for the rougher handling environment accompanying that industry. Systems are even produced with tumbling chambers for surface modification of a large volume of small parts. Aluminum chambers offer an advantage over stainless steel chambers in that aluminum will develop a natural oxide layer that becomes a tough barrier to secondary reactions. Even the best stainless steel has been known to oxidize in a plasma environment and over time the oxidized surface can be a source of undesirable particulate.

Precision cleaning procedures using plasma are performed so that the cleaned surface will be coated or otherwise used as soon as possible after cleaning. Plasma surface treatment produces a molecular clean and water wettable surface with high surface energy. Thus, it has a tendency to adsorb particulate and organic contamination from the ambient environment. Storing the surfaces closed containers will reduce the adsorption of organic contaminant molecules from the ambient air. Particulate contamination will generally create unacceptable defects. Adsorbed organic contaminant molecules, generally less than full monolayer coverage, of order nm thickness, will generate a heterogeneous wettability. This may lead to non-uniform coatings, in particular if deposited from liquid media. Surfaces can never be perfectly clean in ambient air. It is generally recommended that the glass surface be used within a few minutes following its cleaning. As such, it is desirable to minimize the risk of coating defects caused by random ambient contamination.

As noted, plasmas will crosslink an organic contaminant. Crosslinking of thick films of organic contaminants such as oils will hinder cleaning action because it creates a barrier (i.e., carbon) to subsequent plasma reactions. As such, plasma cleaning is generally effective only when the surface is first gross cleaned to remove contaminant film down to 100 microns or less, for example by combining plasma with dense fluid cleaning—an important aspect of the present invention.

Conventional plasma processing thus described is more commonly called dielectric barrier discharge (DBD) plasmas which are of the variety comprising silent discharge, corona, transferred arc, plasma torch and low-pressure glow discharge. These plasmas can be created and used under various pressures, temperatures and using a variety of electrode configurations. Moreover, DBD plasma behavior is observed in solid, liquid and gas phases. Atmospheric pressure glow discharge (APGD) is getting attention today for various applications ranging from air pollution treatment, ozone production and more recently surface cleaning. However, high pressure plasma processing (i.e., P>1 atm) is still a relatively unexploited area. No known prior art exists for creating and using dense fluid plasmas (i.e., supercritical fluid plasmas, solid spray plasmas, liquid spray plasmas) taught herein.

The fundamental properties of DBD plasmas—for example the production of excited species, radicals, ozone and ultraviolet radiation—lead to photophysical and photochemical processes which readily lend themselves to the development of new enhanced surface cleaning, coating or modification processes, especially when used in combination with the variable solvent geometry and many other unique characteristics of dense fluids.

As such, novel and beneficial aspects of the present invention are derived from the combination of dense fluid cleaning solvents such as solid, liquid and supercritical carbon dioxide and application techniques with various types of DBD plasmas (i.e., using different fluid combinations, fluid pressures, temperatures, frequencies, voltages, DBD electrode configurations)—called dense fluid plasma herein. Dense fluid plasma technology enables new surface treatment possibilities not possible using either technology alone. The unique properties of dense fluids, for example being rather inert, having very low dielectric constants (i.e., k<3), and behaving as cleaning solvents allow them to be uniquely exploited herein as dielectric barrier discharge compounds, cleaning agents, extraction agents, drying agents, surface modification agents, deposition agents, plasma atmospheres, and anti-solvent agents within a full range of temperatures and pressures. Moreover, exemplary plasma-aided dense fluid processes taught herein are performed simultaneously or sequentially in a single process reactor which keeps the substrate surface clean, or un-compromised, in-between each process or operation.

Another novel aspect of the present invention is that the plasma process itself may be engineered to provide variable ion concentration—a selective plasma surface treatment. Since ion flux increases with decreasing pressure, adjusting pressure during various uses of plasma in the present invention is a way of controlling selectivity. This is very important in surface treatment applications where a substrate surface, for example a semiconductor wafer, contains both organic and inorganic structures. These structures interact with and react to different plasmas in different ways and at different reaction rates. For example, a less energetic plasma (i.e., atmospheric or super-atmospheric plasma) may be more suitable for an organic photoresist residue removal, when used with a dense fluid cleaning agent, because it decreases the chance for ion damage of adjacent inorganic or organic surface structures. Thus, having a selective plasma treatment is very beneficial—having a selective dense fluid plasma surface treatment technology is enabling.

Finally in another example the present aspect can uniquely produce a 3-dimensionally ultraclean sterile implantable medical device wherein its subsurface pores have been treated to remove as much as 8% by weight of unreacted monomer oils, during which its exposed surfaces are bathed in a sterilizing and surface energy modifying plasma—all in a single operation. This new and improved medical device exhibits enhanced performance such as increased tensile strength which increases its longevity under stress, extremely low potential for leaching of interstitial contaminants (i.e., silicone fluids) into body fluids, its water-wettable surfaces can be more readily adhesively bonded.

Spin Coating

Spin coating processes are used throughout many different industries including semiconductor wafer fabrication, optical glasses, and LCD manufacturing under clean room conditions and with fully automated handling. The coating thickness may vary between several hundreds of nanometers and up to 10 micrometers. Even with non-planer substrates very homogeneous coating thickness can be obtained. The quality of the coating depends on the rheological parameters of the coating liquid. Another important parameter is the Reynolds number of the surrounding atmosphere. If the rotation velocity is in a range, that the atmospheric friction leads to high Reynolds numbers (turbulences), disturbances in the coating quality are observed. The final thickness of a spin coated layer on the processing and materials parameters like angular velocity, viscosity and solvent evaporation rate by the semi-empirical formula;

$$H = A \cdot \omega^{-B}$$

where
  H—coating thickness,
  $\omega$—angular velocity; and
  A and B are constants which are determined empirically.

Spin coating and spin cleaning technology as practiced by the present inventor and others using dense fluids as noted herein suffer from a lack of control of the various surfaces such as atmosphere-dense fluid-substrate and other factors such as drag force, viscosity, fluid chemistry and surface chemistry—all of which are major components in optimizing and controlling the production of thin or thick films and coatings and removing undesirable substances from surfaces. The present invention teaches methods and processes which overcome these limitations.

Chemical Coating

Chemical coating is a process where a chemical reaction, e.g. the reduction of a metal is involved. The most common process is the fabrication of mirrors where the glass surface acts as a nucleating agent for the reduction of Ag+ to Ag0 in presence of reducing agent. The vast majority of all mirrors still are fabricated using this process. Another technology, which is suitable as an example for precipitating copper layers on glass, is the currently metalization process with commercially available liquids after seeding of the surface.

The present invention is teaches methods and processes for producing chemical coatings on substrate surfaces using a process of first coating a substrate with an un-reacted substance and then selectively reacting said first coating with a secondary agent such as plasma, hydrogen, and others to produce the desired chemical coating.

Patterning, Drying and Curing Techniques

Another aspect of the present invention is precision patterning, drying and curing of coated critical substrates such as IC, optical and MEMS wafers. Drying and curing techniques are important for obtaining the appropriate coating properties, as in a lithographic patterning or developing operations. The process may be made very selective through patterned laser exposure. Furthermore, organic polymer or organic-inorganic hybrid coating materials can be cured by a low temperature IR treatment or UV-curing, or reacted with a plasma. The present invention provides methods for selective removal of resists and resist solvents from patterned wafers as well as plasma etch clean-up techniques.

As line sizes becomes smaller and the complexity of semiconductor integrated circuits increases, it is clearly desirable to have a wet processing technique, including a method and apparatus, that actually removes unwanted organic films and particles, prevents additional particles, and does not introduce stains on the wafers. The complete cleaning technique may also include a step of gross drying the wafers, without other adverse results. A further desirable characteristic includes reducing or possibly eliminating the residual water absorbed on wafer surfaces and edges when the gross water phase is removed. The water left absorbed on such surfaces and edges often attracts and introduces more particles onto the semiconductor wafer and is a outgas and adhesion contamination in subsequent photoresist deposition following cleaning and drying operations. The aforementioned conventional techniques fail to provide such desired features, thereby reducing the die yield on the semiconductor following optical printing or lithographic processes.

There is a present need to provide an alternative and integrated surface preparation and deposition technique which overcomes the limitations of conventional technology described above. As such, the present invention relates to the fields of surface cleaning, surface modification, and deposition. The present invention is illustrated in several examples including surface cleaning, surface modification and deposition of an organic or metal-organic film or coating upon a substrate surface. The exemplary substrate surface is a wafer containing a surface mask film such as silica, polysilicon, silicon nitride, silicides, and metals. However it will be recognized that the invention has a wider range of applicability. Merely by way of example, the invention can also be applied to deposition of organic precursors, lubricants, bactericidal agents and other substances wherein a thin film is desired.

The present invention incorporates a unique isobaric dense fluid condensation shear cleaning process, a novel plasma-assisted drying process, plasma-based pre-cleaning and post-treatment steps, a dense fluid condensation shear deposition process, and post-cleaning and deposition reaction steps such as thermal treatment, plasma cleaning, and reactive gas treatments, among many other aspects. For example, the present invention teaches performing multi-step processing of dense fluid cleaning and plasma cleaning in a single process tool. In still another example, the present invention teaches a method, process and apparatus which embodies precision cleaning, drying, surface modification, and deposition within a closed controlled environment.

SUMMARY OF THE INVENTION

The term "dense fluid", as used herein, describes physicochemical states of carbon dioxide, ozone, nitrogen, xenon, argon, and helium, and other fluids, wherein these physicochemical states have densities that are within the range of liquid-like or near-liquid substances, or which behave like liquids in that they will mix or separate due to similar or dissimilar cohesive energy properties, respectively. Giddings gives an equation for calculating cohesive energy for non-polar compressed gases;

$$\delta = 2.56 (P_c)^{1/2} (\rho^r_g/\rho^r_l);$$

where
  $\delta$—cohesive energy,
  $P_c$—critical pressure of compressed gas,
  $\rho^r_g$—reduced density of compressed gas, and
  $\rho^r_l$—reduced density of compressed liquid.

Liquids and compressed gases used in the present invention will generally have cohesion energies within the range of 5 $MPa^{1/2}$ (i.e., supercritical argon at 25 C and 200 atm) to 47 $MPa^{1/2}$ (i.e., water at 25 C and 1 atm). As a general rule, where polar energy and hydrogen bonding energy contributions are insignificant, substances with dispersive energy differences of 5 $MPa^{1/2}$ or more are considered to have limited or no miscibility and will exist as two phases. This is the case for compounds used to form a supercritical fluid anti-solvent and a dense fluid solvent phase for the present invention. Liquid phase compounds having energy contributions due to polarity, complex formation or hydrogen bonding, for example water and methyl alcohol, will exhibit a range of solubility behavior and equations by Hildebrand and others may be used to compute a solubility parameter for these. Organic solids such polymers will exhibit cohesion energies in the general range of 18 $MPa^{1/2}$ to 28 $MPa^{1/2}$ whereas inorganic solids such as silicon and copper exhibit cohesion energies of 300 $MPa^{1/2}$ or more. More solid phase carbon dioxide exhibits a cohesion energy of approximately 22 $MPa^{1/2}$. As such, dense fluids herein describe liquid, supercritical and solid phase dielectric solvents.

As such, conducting cleaning, etching, drying, surface modification and coating reactions under dense fluid conditions and in mixed phase treatments of the present invention affords opportunities to manipulate the reaction environment (interfacial solvent and solvent-substrate surface properties). The reaction environment can be manipulated, via pressure, temperature and type of fluids present, to enhance, or reduce, solubility of reactants and solutes, to modify reaction rates, or decrease particle adhesion on surfaces. Moreover, supercritical cleaning and coating treatments of the present invention affords much improved selectivity by altering the physicochemistry of interfacial constituents intimate with the substrate surface and atmosphere above and below the substrate being treated.

For example, removal of submicron particles requires significant drag or shearing energy, sometimes described as particle shear stress, at the particle-substrate surface interface. In the present invention, a shear stress sufficient to overcome small particle adhesive forces may be applied by the viscous drag force generated by a high velocity dense fluids flowing over the a substrate surface. Dense fluid velocity and density are manipulated in the present invention through phase transitions at the substrate surface to increase viscous drag. Viscous drag force is calculated according to the following equation:

$$F_d = (C\rho)(V^2/2)(A);$$

where
  $F_d$—viscous drag force,
  C—drag force coefficient,
  $\rho$—dense fluid density,
  V—local fluid velocity, and
  A—projected frontal area of small particle.

In the present invention, fluid density and hence viscous drag force is increased by a factor of 2 or more by changing a stream of dense fluid flowing over a substrate surface from supercritical phase to liquid phase. Moreover, the reverse transition, that is liquid phase to supercritical phase, also increases drag force significantly through a decrease in local fluid viscosity. In fact, the predominant factors which increase viscous drag force are to decrease fluid viscosity and increase free stream velocity.

Carbon dioxide exists as a low-density gas at standard temperature and pressure conditions and possesses phase boundaries with a triple point (Solid-Liquid-Gas co-exist in equilibrium like a glass of ice cubes and water) and a critical point (Liquid-Gas have identical molar volumes). Through pressure or temperature modification, carbon dioxide can be compressed into a dense gas state. Compressing carbon dioxide at a temperature below its critical temperature (C.T.) liquefies the gas at approximately 70 atm. Cooling liquid-state or gas-state carbon dioxide to its freezing point causes a phase transition into solid-state carbon dioxide. Compressing carbon dioxide at or above its critical temperature and critical pressure (C.P.) also increases its density to a liquid-like state, however there is a significant difference between compression below and above the critical point. Compressing carbon dioxide above its critical point does not effect a phase change. In fact, carbon dioxide at a temperature at or above 305 K (88 F) cannot be liquefied at any pressure, yet the density for the gas may be liquid-like. At the critical point the density is approximately 0.47 g/ml. At or above this point carbon dioxide is termed a supercritical fluid (SCF). Carbon dioxide, and other dense fluids such as nitrous oxide, sulfur hexafluoride, ammonia, xenon and various hydrocarbon gases, exhibit significant cohesive energy (>12 $MPa^{1/2}$) near the critical point, which is around ambient temperature for most of the compounds cited above.

Similarly, nitrogen exists as an inert gas phase at atmospheric temperature and pressure. Nitrogen can be compressed to near or above its critical point through pressure and temperature adjustment. The critical pressure and temperature for nitrogen are 33.5 atm and −147 C, respectively. Nitrogen, and compounds such as argon and helium, are chosen as supercritical fluid ant-solvents for use in the present invention because they can be compressed to supercritical conditions. However nitrogen, argon and helium do not exhibit strong cohesive energy (<5 $MPa^{1/2}$) under the supercritical carbon dioxide temperature conditions of the present invention because they are so far above their own critical temperatures.

Supercritical carbon dioxide and supercritical nitrogen can be compressed to a range of liquid-like densities, yet it they retain the diffusivity of a gas. For example, compression of carbon dioxide above its critical temperature causes a progressive increase in density, approaching that of its liquid phase. Combining supercritical fluids such as carbon dioxide and nitrogen or argon provides unique stratification and interfacial behavior which is very different from conventional standard temperature-pressure solvent mixtures or using liquefied gases as solvents. Cohesion energy and density differences between the dense fluids can be varied using pressure and/or temperature. This provides the ability to manipulate interfacial chemistry near the substrate surface and within the feed solvent phase.

The present invention exploits the ability to separate two dense gases based upon divergent cohesive energy characteristics. Using pressure and temperature control, carbon dioxide is compressed and heated to a liquid or supercritical fluid solvent phase—in a range of pressures and temperatures from just below to above the critical point. Similarly, nitrogen or argon may be pressurized and heated to form a supercritical fluid phase anti-solvent phase—in a range of pressures and temperatures below, equal to or above the critical point for carbon dioxide. The atmospheric and fluid phases each exhibit divergent cohesive energy—the nitrogen phase exhibits anti-solvent behavior with the carbon dioxide phase. Solvent-Anti-solvent supercritical fluid systems can be produced using other gas mixtures, for example nitrous oxide (solvent)—argon (non-solvent), carbon dioxide (solvent)—argon (non-solvent).

The present invention utilizes preferably liquid or supercritical carbon dioxide as a cleaning or deposition agent and solvent phase to deliver solutes such as organic solvent modifiers, surface cleaning enhancement agents, coatings, wetting agents, surface treatment agents or reaction precursors, into an established atmosphere comprising an anti-solvent such as supercritical nitrogen or argon. Other suitable inert gases may be used if they can be compressed to a supercritical fluid condition within a closed environment and exhibit non-solvent or anti-solvent selective behavior with the applied dense fluid solvent phase. Thus, a supercritical fluid anti-solvent environment (i.e., SCAr, SCHe, $SCN_2$) is used to selectively 'precipitate' solutes contained or entrained within a liquid or supercritical dense fluid solvent phase, and/or to selectively change the density and cohesive energy of the dense fluid solvent phase applied to a substrate. For example, the supercritical anti-solvent can be controlled to cause a quantity of supercritical fluid to selectively condense to a liquid phase or vapor phase upon contact with a substrate surface.

Supercritical carbon dioxide, which may entrain or dissolve one or more solutes such as organic solvents, coatings, ozone, is injected into a supercritical anti-solvent atmosphere in close proximity to but above a rotating substrate, whereupon through various control parameters such as, for example, solvent phase chemistry, substrate spin rate, supercritical atmosphere (non-solvent) pressure and temperature, and electric field, unique and beneficial substrate-solvent-solute interfacial phenomenon can be produced.

A first aspect of the present invention utilizes a novel isobaric and super-atmospheric vapor condensation mechanism for both cleaning and deposition processes and methods described herein. An examination of the following commercial cleaning and coating processes utilizing atmospheric and sub-atmospheric condensation processes will aid in understanding the novel features and benefits of the present invention.

Vapor Degreasing

Under constant atmospheric pressure, a condensable cleaning vapor is formed above a sump by boiling a cleaning solvent such as trichloroethane within a tank. A substrate, which is cooler than the vapor, is lowered into the clean condensable vapor above the boiling liquid, whereupon the clean vapor condenses uniformly over the substrate, dissolving contaminants and shearing particles from the substrate surfaces. This occurs because the vapor is saturated and all that is necessary is a temperature shift to cause it to change phase to liquid. Dirty condensed liquid flows downward under the influence of gravitational force, drips from the substrate and returns back into the boiling tank below. This process can continue until the substrate temperature equals the vapor temperature.

Chemical Vapor Deposition

Similar to vapor degreasing above and under constant sub-atmospheric pressure (i.e., vacuum), a heated atmosphere containing a condensable component is contacted with a substrate, which is at a temperature lower than the vapor temperature. This causes a uniform fraction of chemical vapor to condense onto the substrate. Vapor concentration, vacuum pressure, substrate-vapor temperature differential, and contact time are typical process control parameters in this analog condensation process.

As such, the first aspect of the present invention is a process called critical fluid condensation shear cleaning. While a substrate is spun on an axis (either a horizontal and/or vertical orientation respective to earth plane), supercritical carbon dioxide, which may contain one or more cleaning enhancement additives such as supercritical ozone, organic solvents or trace water, is selectively contacted, under vapor saturation conditions, on a portion of a rotating substrate. Under the action of centripetal force, the supercritical fluid solvent phase rapidly moves outward over the substrate surface filling all surface features with supercritical fluid cleaning agent. During this, heat transfer between the supercritical fluid solvent phase and the substrate surface, both below and above, is selectively controlled to manipulate the solid-solvent-antisolvent interfacial physicochemistry.

For example, if under relatively constant supercritical argon pressure conditions and which is above or equal to the critical pressure but below the temperature of the supercritical carbon dioxide solvent being applied and if the substrate surface temperature (Ts) is less than the supercritical fluid solvent phase temperature (Tdf) being applied to it, that is Ts<Tdf, the interfacial density, viscosity and cohesive energy will increase and the fluid phase will transition to liquid phase—or condense following contact or during spreading. During this process, the supercritical fluid is moving over a substrate surface outwardly, first contacting and filling microscopic voids, cracks and vias and then condensing within these surface features. Under constant centripetal force, a very beneficial and unique particle wetting and surface shear stress cleaning action is constantly being produced and applied—called critical fluid condensation shear cleaning, or deposition, processes herein.

The entire substrate surface may be heated from a lower temperature to the temperature of the supercritical fluid solvent being applied over the surface, in which case condensation shear cleaning ceases. The substrate surface temperature heats from the center contact point in a radial direction outward toward the perimeter of the substrate and reaches equilibrium with the spray solvent temperature in this manner. This is much more efficient than changing the temperature of the dense fluid surrounding the substrate. Alternatively, the substrate may be cooled from below using the condenser to produce a continuous condensation shear cleaning action over the substrate being treated. Thus, by varying the cooling rate below the substrate, the topside surface condensation shear process may be controlled.

A particular advantage of the present invention as opposed to prior art is the application of a relatively small quantity of dense fluid (solvent) to the topside surface of a rotating substrate within an established and substantially inert (anti-solvent) supercritical nitrogen (or other suitable dense gas antisolvent) environment. For example, dense fluid solvents chosen for the present invention have higher densities, and very divergent cohesion energies, than the dense fluid anti-solvents. Because of the differences in dielectric properties between and overall poor thermal conductivities of the dense fluids chosen for the present invention, the processing environment can be segregated into distinct zones which have different properties and are used to control certain aspects of the exemplary treatment processes described herein.

For example, selectively applying heat energy to an upper portion or zone of the anti-solvent atmosphere (Ta), where Ta>Tdf, and extracting heat from the lower portion or zone of the anti-solvent atmosphere (T<Tscf), the supercritical carbon dioxide may be selectively condensed to a liquid-phase within a lower hemisphere of the process chamber and collected simultaneously during the application of the supercritical fluid spray to the substrate surface above. Due to the poor thermal conductivity between the anti-solvent phase and solvent phases of the present invention, a temperature gradient can be established in the process chamber under relatively constant pressure. Thus, a thermal gradient and a constant pressure (isobaric) process condition can be maintained within the chamber and between a dense fluid supply tank during processing. An anti-solvent supercritical fluid zone is established above and surrounding the substrate to selectively alter the interfacial physicochemistry (change cohesion energy or change phase) of a dense fluid solvent spray and substrate surface.

In addition, and simultaneously with the application of the supercritical fluid solvent, a lower temperature zone may be established below the substrate surface to collect reacted dense fluid as a 'condensed phase', which separates readily within the process chamber due to both density and cohesive energy increases. Thus, another advantage of the present invention is that a variety of dense fluid solvent pressures, temperatures and conditions can be applied to and reacted with the surface of a substrate under isobaric conditions and using pulsation, gravity flow, or high pressure spray techniques. Moreover, another advantage of the present invention is that the process chamber does contain a significant quantity of liquefied dense fluid phase carbon dioxide or other spent dense fluid solvent at any given time. Contaminants, water and particles contained within a hemisphere below a substrate and in a very small quantity of dense fluid relative to the volume of the process chamber are much less likely to become entrained within the anti-solvent phase due to significant differences in cohesion energy, density, and viscosity. Therefore the use of a condensed-phase zone as taught herein serves as a liquid trap for reaction by-products and prevents re-deposition of contaminants onto substrate surfaces above.

In another aspect of the present invention, a substrate is plasma cleaned in a supercritical argon atmosphere at a temperature which is below the critical temperature and greater than the critical pressure of carbon dioxide. Under these conditions, the substrate is rotated in a clockwise or counter-clockwise direction. The impingement spray, in this case liquid carbon dioxide, is introduced at a pressure that is equal to or greater than the internal anti-solvent atmosphere. In fact, the dense fluid spray pressure and temperature can be applied at much greater pressure than the internal pressure of the anti-solvent atmosphere.

During application of the dense fluid jet spray, a high voltage high frequency showerhead electrode is energized. The supercritical argon and liquid carbon dioxide acts as a dielectric barrier fluid, through which a uniform plasma discharge is created. The presence of oxygen (carbon dioxide is a source of oxygen) in the dense fluid fluid flow over the substrate results in the generation of oxygen radicals and supercritical ozone which serve as powerful surface cleaning adjuncts.

Moreover, plasma adjuncts of the present invention may be used under sub-atmospheric and atmospheric conditions which provide a capability producing clean or etched substrates using combinational cleaning under different pressure, temperature, fluid conditions and with different gaseous and liquid admixtures. This capability allows the operator to develop any variety of highly selective substrate treatment processes incorporating cold and thermal plasma treatments with liquid and supercritical phase dense fluid treatments. Still moreover, plasma-aided deposition processes may be developed with the dense fluid cleaning treatments.

Process variables for the present invention include, among others, dense fluid solvent spray pressure, temperature, and flow rate, substrate rotational velocity, and supercritical fluid anti-solvent pressure, chemistry (type of gas or mixture), pressure and temperature, and electric field strength (plasma density). These variables must be optimized for each type of substrate treated and for each type of treatment process developed—for example a "dry-clean-deposit" or a "clean-etch-clean" treatment combination. For example, it may be optimal to slowly flow supercritical carbon dioxide containing a deposition compound over a cold substrate (e.g. 15 C) which is rotated at a low angular velocity (e.g. 10 rpm) to produce a desired coating thickness. In another example, it may be optimal to spray a substrate with high pressure liquid carbon dioxide over a superheated substrate (e.g. 100 C) rotating at very high angular velocity (e.g. 2000 rpm) to remove tenacious surface contaminants.

Following is an example method which illustrates a first aspect of the present invention. It can be used as a replacement for conventional organic solvent vapor degreasing and drying techniques.

An exemplary critical fluid condensation shear cleaning method comprising the following steps:
 1. Placing a substrate into a pressure vessel in any fixture and at any orientation horizontal or vertical and relative to the earth plane and optionally rotate the substrate about its central axis at between 1 and 5000 rpm clockwise, counter-clockwise or bi-directionally;
2. Establishing a first supercritical fluid anti-solvent phase within said pressure vessel which completely surrounds and contacts said substrate surfaces at pressures and temperatures above said anti-solvent phase critical points;
3. Contacting said substrate surfaces or a portion of said substrate surfaces thereof contained in said first supercritical fluid anti-solvent phase with a continuous or pulsed stream of pre-determined quantity of condensable second phase of supercritical fluid solvent phase, which is of substantially less volume than that of the first anti-solvent phase, and which may contain one or more cleaning enhancement additives, to produce a film of advancing supercritical fluid cleaning solvent and additives on said substrate surface or portion of said substrate surface;
4. Selectively altering the physicochemistry of said second supercritical solvent phase at said substrate surfaces or portion thereof (cleaning zone) at relatively constant pressure to form a third advancing and condensing solvent phase on said substrate surfaces or portion of said substrate surfaces to separate substrate surface contaminates to form a clean substrate;
5. Controlling said first supercritical fluid anti-solvent phase contained within said pressure vessel to have a temperature which is less than, equal to or greater than the temperature of said substrate surfaces in a zone above said substrate surface;
6. Controlling said first supercritical fluid anti-solvent phase contained within said pressure vessel to have a temperature which is less than the temperature of said substrate in a zone below said substrate surface;
7. Capturing said third condensed solvent phase, contaminates and additives at a constant pressure within a zone of said pressure vessel which is below said substrate;
8. Immediately removing said third condensed solvent phase, contaminates, and additives from said pressure vessel to prevent re-contaminating the process chamber and substrate;
9. Repeating steps 3 through 9 as required to produce a clean substrate;
10. Removing first supercritical fluid anti-solvent phase from said pressure vessel; and
11. Removing said cleaned substrate from said pressure vessel.

Exemplary Definitions for First Aspect

Substrates and substrate surfaces and portions thereof may include any one or combination of wafers, semiconductors, pores, vias, trenches, planes, interfaces, optical components, MEMS, metals, ceramics, glasses, polymers, organics, inorganics, biomedical, optoelectronic and others.

Substrate fixtures may include one or a combination of spin processor, temperature controlled plates, drums, baskets, rack or a shelf.

First supercritical anti-solvent phase compounds include one or a combination of supercritical nitrogen, supercritical argon, supercritical oxygen, supercritical xenon, and supercritical helium.

Second supercritical solvent phase compounds include one or a combination of supercritical carbon dioxide, supercritical nitrous oxide, and supercritical hydrocarbons.

Third condensed solvent phase compounds include one or a combination of liquid carbon dioxide, liquid nitrous oxide, and liquid hydrocarbons.

Additives may include any one or combination of gases, liquids, solids, organics, inorganics, ionics, non-ionics, oxygen, fluorinated compounds, polymers, organic coupling agents, solvents, water, electromagnetic energy, acoustic energy, ultraviolet radiation, microwaves, and infrared heating energy.

Contaminates may include any one or combination of carbon, fluorine, water, ionics, non-ionics, metals, oxides, hydrocarbons, fluorocarbons, organics, inorganics, radioactive, biological, particulate and others.

A second aspect of the present invention is the capability to dissolve or entrain coatings and other substances in a supercritical solvent phase such as supercritical carbon dioxide and selectively deposit said solutes onto a substrate surface. The process of selectively depositing a substance onto a substrate surface is similar to the condensation shear cleaning mechanism described above, and is called condensation shear deposition herein.

Supercritical carbon dioxide or another suitable supercritical solvent, entraining or dissolving various components such as organic solvents and coating resins is injected onto a portion of a rotating substrate, whereupon through the various control parameters described above, the solutes can be selectively deposited onto the substrate surface as the supercritical fluid solvent phase is distributed across the substrate surface.

Under the action of centripetal force or the flow of the applied dense fluid, the supercritical fluid solvent phase rapidly moves outward over the substrate surface filling all substrate surfaces with supercritical fluid deposition agent. During this, heat transfer between the supercritical fluid solvent phase and the substrate surface, both below and above, is selectively controlled to manipulate the substrate solid-dense fluid interface.

For example, if under relatively constant supercritical nitrogen pressure conditions in which the supercritical nitrogen pressure is above or equal to the critical pressure of the supercritical carbon dioxide fluid solvent and the supercritical nitrogen temperature is greater than the temperature of the supercritical carbon dioxide solvent being applied to the surface, and if the substrate surface temperature (Ts) is greater than the supercritical fluid solvent phase temperature (Tscf) being applied to it, that is Ts>Tscf, the interfacial density, viscosity and cohesive energy will decrease and the fluid phase cohesion energy will decrease—or selectively condense solute from solution during contact or during spreading.

During this process, the supercritical fluid is moving over a substrate surface outwardly, first contacting and filling microscopic voids, cracks and vias and then condensing within these surface features. Moreover, under constant centripetal force, the anti-solvent (supercritical nitrogen) diffuses into the film of spreading supercritical fluid causing rapid changes in solvent power. Also, as in the example for the cleaning aspect described above, the supercritical fluid solvent phase containing the coating agent may be adjusted to cause a phase transition from supercritical fluid to liquid phase as the solvent phase flows over the substrate being treated.

An example method which illustrates a second aspect of the present invention follows. It can be used as a replacement for conventional spin coating and chemical vapor deposition techniques.

An exemplary critical fluid condensation shear deposition method comprising the following steps:
1. Placing a substrate into a pressure vessel in any fixture and at any orientation horizontal or vertical and relative to the earth plane and optionally rotate the substrate about its central axis at between 1 and 5000 rpm clockwise, counter-clockwise or bi-directionally;
2. Establishing a first supercritical fluid anti-solvent phase within said pressure vessel which completely surrounds and contacts said substrate surfaces at pressures and temperatures above said anti-solvent phase critical points;
3. Contacting said substrate surfaces or a portion of said substrate surfaces thereof contained in said first supercritical fluid anti-solvent phase with a continuous or pulsed stream of pre-determined quantity of condensable second phase of supercritical fluid solvent phase, which is of substantially less volume than that of the first anti-solvent phase, and which contains one or more deposition compounds and agents or additives, to produce a film of advancing supercritical fluid deposition solvent phase on said substrate surface or portion of said substrate surface;
4. Selectively altering the physicochemistry of said second supercritical deposition solvent phase at said substrate surfaces or portion thereof (deposition zone) at relatively constant pressure to form a third advancing and condensing deposition solvent phase on said substrate surfaces or portion of said substrate surfaces to selectively and uniformly deposit a fraction of deposition compound or agent contained therein onto separate substrate surfaces or portions thereof to form a coated substrate;
5. Controlling said first supercritical fluid anti-solvent phase contained within said pressure vessel to have a temperature which is less than, equal to or greater than the temperature of said substrate surfaces in the zone above said substrate surface;
6. Controlling said first supercritical fluid anti-solvent phase contained within said pressure vessel to have a temperature which is less than the temperature of said substrate in a zone below said substrate surface;
7. Capturing said third condensed deposition solvent phase containing excess deposition compounds and agents at a constant pressure within a zone of said pressure vessel which is below said substrate surfaces and portions thereon;
8. Immediately removing said third condensed deposition solvent phase and excess deposition compounds and agents from said pressure vessel to prevent re-contaminating the process chamber and substrate, and (exemplary follow-on procedures 9, 10, 11, 12);
9. Repeating steps 3 through 9 as required to produce a desired thickness of deposition compound or agent on said substrate surfaces or portions thereon;
10. Repeating steps 3 through 9 with deposition additives such reducing agents to form a reduced coating on said substrate surfaces or portions thereon and/or;
11. Repeating steps 3 through 9 with deposition additives such infrared heat to form a semi-rigid coating on said substrate surfaces or portions thereon and/or;
12. Repeating steps 3 through 9 with deposition additives such plasma to form a coating on said substrate surfaces or portions thereon;
13. Removing first supercritical fluid anti-solvent phase from said pressure vessel; and
14. Removing said coated substrate from said pressure vessel.

Exemplary Definitions of Second Aspect

Substrates and substrate surfaces and portions thereof may include any one or combination of wafers, semiconductors, pores, vias, trenches, planes, interfaces, optical components, MEMS, metals, ceramics, glasses, polymers, organics, inorganics, biomedical, optoelectronic and others.

Substrate fixtures may include one or a combination of spin processor, temperature controlled plates, drums, baskets, rack or a shelf.

First supercritical anti-solvent phase compounds include one or a combination of supercritical nitrogen, supercritical argon, supercritical oxygen, supercritical xenon, and supercritical helium.

Second supercritical deposition solvent phase compounds include one or a combination of supercritical carbon dioxide, supercritical nitrous oxide, and supercritical hydrocarbons.

Third condensed deposition solvent phase compounds include one or a combination of liquid carbon dioxide, liquid nitrous oxide, and liquid hydrocarbons.

Deposition compounds and agents may include one or more organic, inorganic, polymers, resins, wetting agents, adhesion promoters, metal-organic compounds Additives and agents may include any one or combination of gases, liquids, solids, organics, inorganics, ionics, non-ionics, oxygen, reducing agents, oxidizing agents, fluorinated compounds, polymers, solvents, water, electromagnetic energy, acoustic energy, ultraviolet radiation, microwaves, and infrared heating energy.

A third aspect of the present invention is to form a sub-atmospheric, atmospheric or super-atmospheric plasma above the substrate prior to, during or following condensation shear cleaning and coating methods described above. Moreover, the third aspect of the present invention may be used without first forming a supercritical fluid anti-solvent atmosphere and without using the condensation shear cleaning and deposition methods herein.

An example method which illustrates a third aspect of the present invention follows. It can be used as a replacement for conventional plasma treatment techniques. A pulsed or continuous electric field of between 500 and 250,000 volts, and at a frequency of between 100 KHz and 10 GHz, may be selectively applied to a substrate surface within a dense fluid process chamber using a suitable dielectric barrier discharge electrode configuration. Various electrode arrangements are possible to establish an electric field suitable for performing any one or a combination of the following plasma-aided dense fluid processes, among others:
1. Sub-atmospheric plasma cleaning and etching;
2. Atmospheric plasma cleaning and etching;
3. Super-atmospheric (supercritical plasma) cleaning, extraction, drying and etching; and
4. Plasma-aided deposition processes described herein.

An exemplary critical fluid condensation shear plasma cleaning method comprising the following steps:
1. Place a substrate into a pressure vessel in any fixture and at any orientation horizontal or vertical and relative to the earth plane and optionally rotate the substrate about its central axis at between 1 and 5000 rpm clockwise, counter-clockwise or bi-directionally;
2. Establish a first supercritical fluid anti-solvent phase within said pressure vessel which completely surrounds and contacts said substrate surfaces at pressures and temperatures above said anti-solvent phase critical points;
3. Contact said substrate surfaces or a portion of said substrate surfaces thereof contained in said first supercritical fluid anti-solvent phase with a continuous or pulsed stream of pre-determined quantity of liquid carbon dioxide to form a solvent phase, which contains one or more cleaning enhancement compounds and agents or additives, to produce a film of advancing liquid carbon dioxide solvent phase on said substrate surface or portion of said substrate surface;
4. Pulse or continuously energize an electrode positioned at a pre-determined distance from and orientation to said substrate at a voltage of between 500 volts and 250,000 volts at a frequency of between 100 KHz and 10 GHz and a power of between 50 and 5000 watts;
5. Selectively alter the physicochemistry of said solvent phase at said substrate surfaces or portion thereof (plasma cleaning zone) at relatively constant pressure to form a third advancing plasma solvent phase on said substrate surfaces or portion of said substrate surfaces to selectively and uniformly clean or etch or react a substrate surface or portion thereof;
6. Control said first supercritical fluid anti-solvent phase contained within said pressure vessel to have a temperature which is less than, equal to or greater than the temperature of said substrate surfaces in the zone above said substrate surface;
7. Control said first supercritical fluid anti-solvent phase contained within said pressure vessel to have a temperature which is less than the temperature of said substrate in a zone below said substrate surface;
8. Capture said third condensed plasma solvent phase containing excess cleaning enhancement compounds and contaminants at a constant pressure within a zone of said pressure vessel which is below said substrate surfaces and portions thereon;
9. Immediately remove said third condensed plasma solvent phase and contaminants from said pressure vessel to prevent re-contaminating the process chamber and substrate, and (exemplary follow-on procedures 10, 11);
10. Repeat steps 3 through 9 as required to produce a desired cleanliness or etched surface on said substrate surfaces or portions thereon; and/or
11. Repeat steps 3 through 9 with deposition additives to form a plasma-reacted coating on said substrate surfaces or portions thereon and/or;
12. Remove first supercritical fluid anti-solvent phase from said pressure vessel; and
13. Remove dense fluid plasma cleaned substrate from said pressure vessel.

Exemplary Definitions of Second Aspect

Substrates and substrate surfaces and portions thereof may include any one or combination of wafers, semiconductors, pores, vias, trenches, planes, interfaces, optical components, MEMS, metals, ceramics, glasses, polymers, organics, inorganics, biomedical, optoelectronic and others.

Substrate fixtures may include one or a combination of spin processor, temperature controlled plates, drums, baskets, rack or a shelf.

First supercritical anti-solvent phase compounds include one or a combination of supercritical nitrogen, supercritical argon, supercritical oxygen, supercritical xenon, and supercritical helium.

Second plasma cleaning solvent phase compounds include one or a combination of supercritical carbon dioxide, supercritical nitrous oxide, and supercritical hydrocarbons.

Third condensed plasma solvent phase compounds include one or a combination of liquid carbon dioxide, liquid nitrous oxide, and liquid hydrocarbons.

Cleaning enhancement agents may include one or more oxygen, hydrogen peroxide, hydrogen, nitrous oxide.

Additives and agents may include any one or combination of gases, liquids, solids, organics, inorganics, ionics, non-ionics, oxygen, reducing agents, oxidizing agents, fluorinated compounds, polymers, solvents, water, electromagnetic energy, acoustic energy, ultraviolet radiation, microwaves, and infrared heating energy.

In another example, supercritical carbon dioxide is selectively contacted with a substrate may be subjected to a strong electric field to form a supercritical plasma. During this process, the supercritical fluid is moving over a substrate surface. Plasma conditions will produce in-situ radicals such as oxygen radicals and supercritical ozone within the flowing stream of dense fluid (dielectric fluid). These radicals significantly enhance the removal of recalcitrant residues such as carbon-fluorine compounds (CFx), common following photoresist removal processes using fluorine-aided ($CF_4$) vacuum plasma etching processes. Moreover, the presence of strong electric fields assists with decreasing the surface tension of water trapped in Vias and between silicon interfaces such as those found in MEMS devices. As such, a novel use for an electric field in the present invention is to efficiently clean and precision dry semiconductor and MEMS devices Thus, the third aspect of the present invention is to produce different beneficial plasmas by varying temperatures, pressures, and dense fluid combinations, and using dense fluids as dielectric barrier materials which aids in removing or depositing compounds to and from substrate surfaces.

A fourth aspect of the present invention is combination of the methods described herein to provide a completely integrated substrate cleaning, surface modification and deposition system. This may include integrating conventional wet acid etching, cleaning and rinsing procedures into the dense fluid system, followed by dense fluid drying and cleaning methods described herein. It may also include post-treatment methods for dense fluid deposition methods described herein. For example, to produce a soft-baked or heat cured coating or may include the step of re-cleaning or dense fluid solvent developing (i.e., patterning) the reacted and coated substrate. In another example, reactants may be introduced, for example a fluorine gas, to substrate having a uniform coating of polyalkylether or polyarylether film to produce a fluoropolymeric coating having improved solvent resistance properties or a very low dielectric constant. These methods may be performed within the same process chamber but using different dense fluid combinations, atmospheric pressures and temperatures, and treatment sequencing. For example, dense fluid solvent washing and developing may be performed using the condensation shear cleaning process above. Heat curing can then be performed under atmospheric or vacuum conditions using the present invention by heating the atmosphere over and below the coated substrate using exemplary substrate temperature control systems. Finally, a vacuum may be created and a partial pressure of gaseous reactants may be introduced over the substrate with a plasma to provide etching or planarization.

Thus the present invention has extensive utility in that it can be used to clean, etch, disinfect and sterilize, coat and react substrates in the same process chamber exploiting the unique properties of dense fluids. Moreover, the present invention allows for the integration of other wet and dry processes and process chemistries such as etching agents, acid treatments, alkaline treatments as well as reactive gases under dense fluid, atmospheric and vacuum conditions. This has the added benefit of clustering many wet and dry processes into one integrated cleaning-substrate treatment-drying production tool. This capability provides multiple surface cleaning and treatment capabilities into a small footprint in production environments—which lowers cost and increases performance.

DETAILED DESCRIPTION

The isobaric processing environment created for performing the various exemplary aspects of the present invention is established using a mixture of two dense fluids with one serving as an anti-solvent and the other serving as the solvent.

Figure 1A:
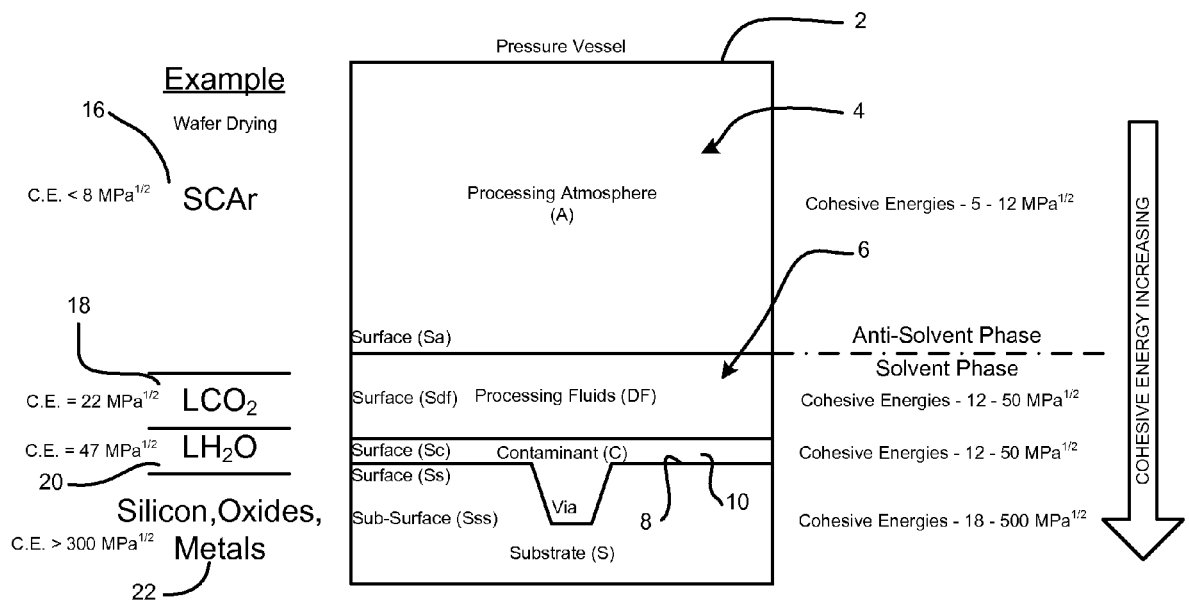
FIG. 1a—Exemplary graphic showing the relationships between a mixture of anti-solvent, solvent, substrate and contaminant.

Referring to FIG. 1a, the exemplary anti-solvent phase-solvent phase cleaning and deposition environment is created by first fluidizing a pressure vessel (2), shown schematically, with a first dense fluid to create a supercritical processing atmosphere (4). Into the supercritical processing atmosphere (4), a second dense fluid is selectively introduced to form a supercritical, liquid or plasma processing fluid (6) therein and which is generally introduced at a location between the processing atmosphere (4) and a substrate surface and sub-surfaces (8) containing various contaminant layers (10) thereon. Thus as shown in the graphic, the exemplary processing environment is developed as discrete layers having surfaces located between each layer, creating two important and general layers described as an anti-solvent phase (12) and a solvent phase (14). Cohesive energies for the various layers show a distinct pattern—generally being very low, or non-solvent ($<12$ MPa$^{1/2}$), in the anti-solvent phase and very high in the solvent phase ($<12$ MPa$^{1/2}$). An exemplary processing environment is given in the graphic showing:

| | |
|---|---|
| Processing atmosphere (anti-solvent): | supercritical argon (16); |
| Processing fluid (solvent): | liquid carbon dioxide (18); |
| Contaminant: | liquid water (20); |
| Substrate/Surfaces: | silicon, oxides, metals (22) |

Figure 1B:
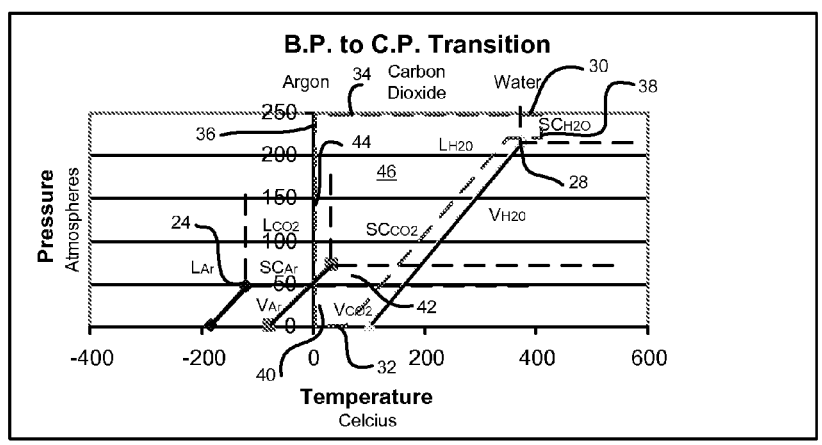
FIG. 1b—Exemplary mixed phase diagram showing phase relationships between a mixture of supercritical anti-solvent, dense fluid solvent, and contaminant (water) under various pressures and temperatures. This figures also shows the pressure and temperature boundary for using the present invention.

FIGS. 1a and 1b graphically describe the variety and nature of isobaric processing environments may be created using the present invention. Moreover, any number of possible substrate, substrate surfaces and contaminants may be processed using the present invention.

FIG. 1b shows a mixed phase diagram for argon, carbon dioxide and water. Shown in the figure are the critical point for argon (24), critical point for carbon dioxide (26), and the critical point for water (28). Although not the actual liquid-vapor boundary for each fluid or fluid-mixture represented, the approximate liquid-vapor boundaries are represented from the critical point to the atmospheric boiling point for each fluid and with the pure-component supercritical regions represented by the vertical and horizontal axes originating at the critical points for each pure component. The pressure-temperature (P-T) boundary (30) in the present invention ranges in pressures from 100 mTorr (32) to 250 atm (36) and in temperatures ranging from 10 C (38) to 300 C (38). This P-T boundary (30) allows for the establishment of several different combinations of processing atmosphere (FIGS. 1a, 4) and processing fluid (FIGS. 1a, 6). For example, processing atmospheres may comprise gaseous argon-gaseous carbon dioxide (40) for sub-atmospheric and atmospheric plasma cleaning, supercritical argon-gaseous carbon dioxide (42) for super-atmospheric plasma cleaning, supercritical argon-liquid carbon dioxide (44) for plasma and condensation shear cleaning, and supercritical argon-supercritical carbon dioxide (46) for plasma and condensation shear cleaning.

Exemplary dense fluid anti-solvents suitable for use with the present invention include helium, argon, nitrogen, oxygen, and mixtures thereof. Exemplary dense fluid solvents suitable for use with the present invention include carbon dioxide, nitrous oxide, ammonia, fluorocarbons, xenon, and sulfur hexafluoride.

Figure 2:
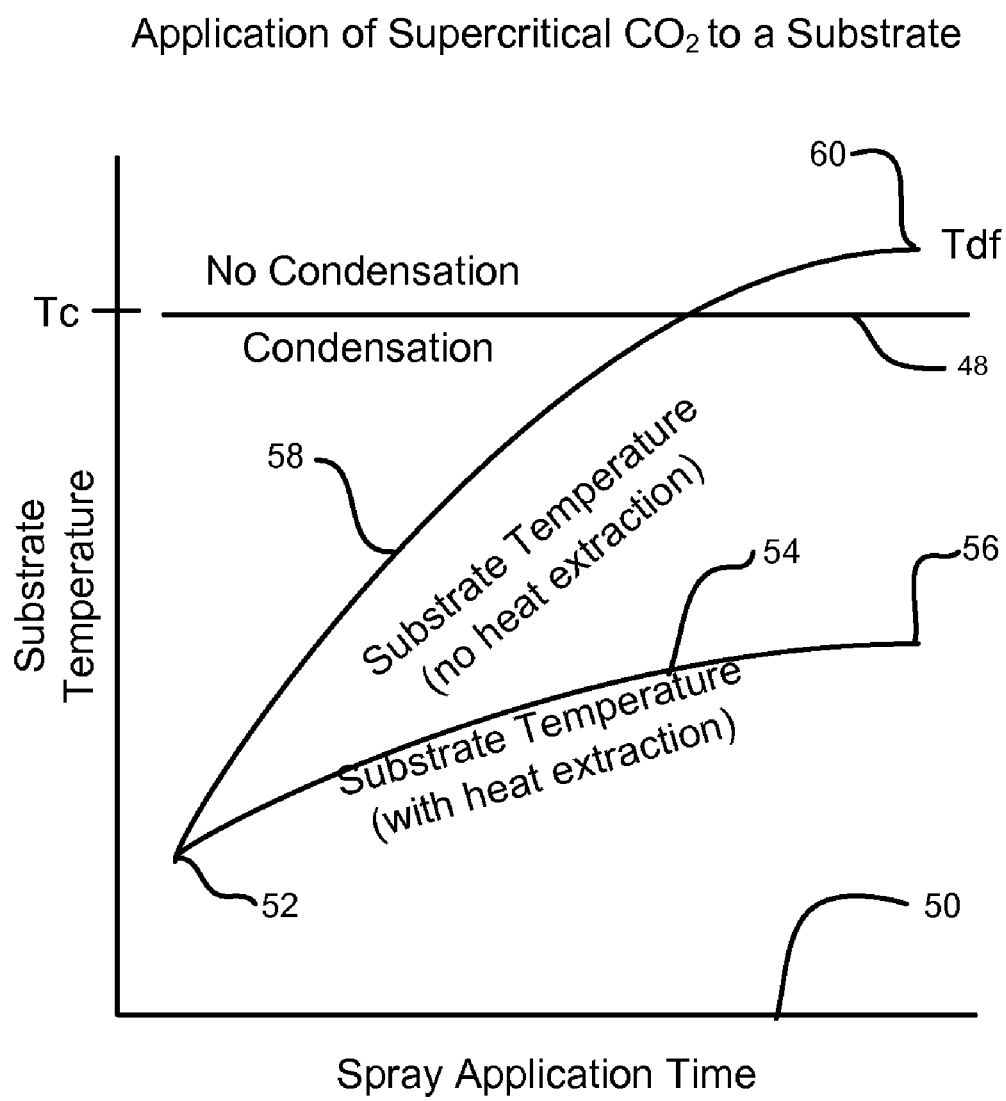
FIG. 2—Exemplary graphic describing a condensation isobar for supercritical fluid spray onto a substrate.

FIG. 2 shows temperature profiles produced when contacting a supercritical dense fluid to a substrate having an controlled temperature and an uncontrolled temperature while contained in a supercritical anti-solvent. Referring to FIG. 2, once a suitable anti-solvent environment is established, a dense fluid solvent may be selectively contacted with a substrate surface. A dense fluid solvent such as supercritical carbon dioxide may be contacted with a substrate which is held at a temperature (Ts) which is below the critical temperature (Tc) of the dense fluid (48). During application of the supercritical carbon dioxide solvent over a period of time (50), the substrate surface having a starting temperature (52) will rise (54) and reach a second equilibrium temperature (56) equilibrium at some point during the application time (50). This rate of increase and final equilibrium temperature is determined by the rate of heat extraction from the substrate. Under these conditions, the supercritical fluid is continuously condensing along the substrate from supercritical fluid phase to liquid phase. However if the substrate is not actively cooled and starts under the conditions of Ts<Tc, and as the supercritical fluid continues to bathe the substrate, the substrate temperature will rise in temperature (58) until it reaches an equilibrium temperature (60) with the supercritical carbon dioxide solvent. When the temperature rises to or above the critical temperature of the dense fluid (48), the solvent will cease condensation.

Figure 3:
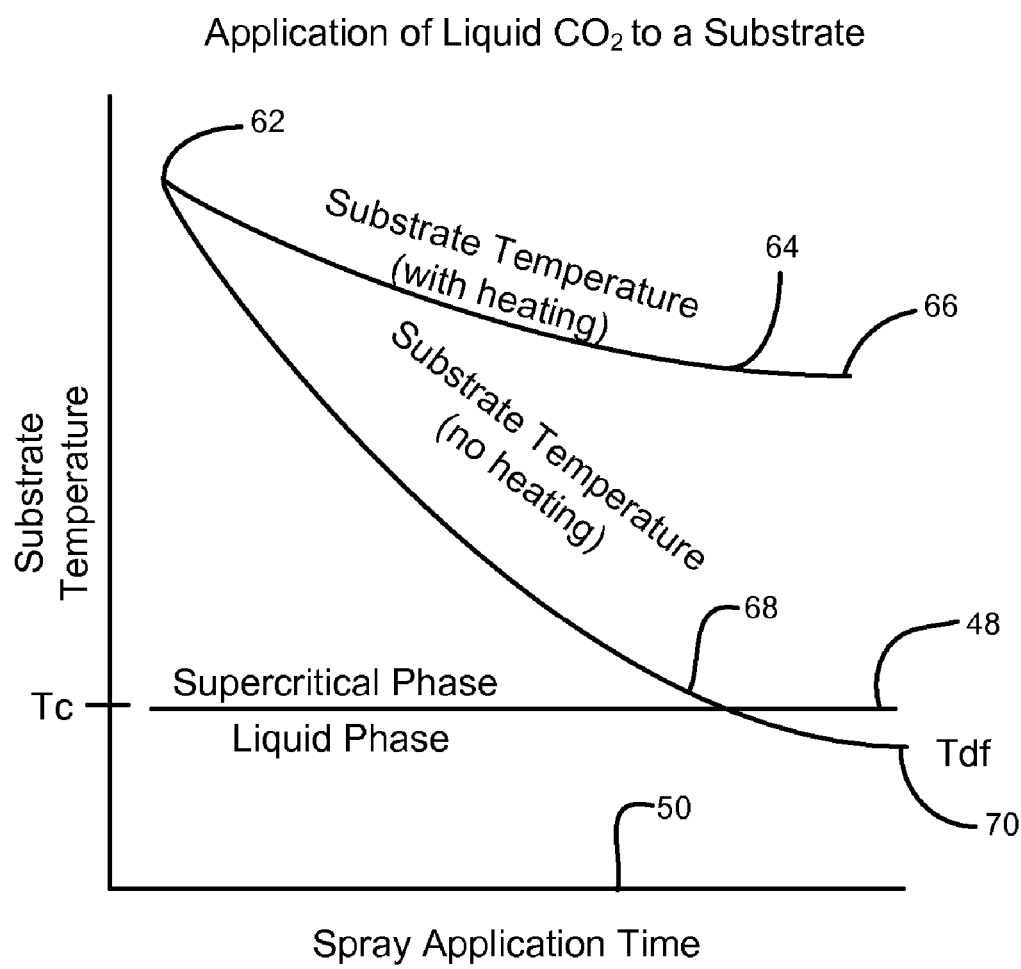
FIG. 3—Exemplary graphic describing a phase change isobar for liquid spray onto a substrate.

FIG. 3 shows temperature profiles produced when contacting a liquid state dense fluid to a substrate having an controlled temperature and an uncontrolled temperature while contained in a supercritical anti-solvent. Referring to FIG. 3, once a suitable anti-solvent environment is established, a dense fluid solvent may be selectively contacted with a substrate surface. A dense fluid solvent such as liquid carbon dioxide may be contacted with a substrate which is held at a temperature (Ts) which is above the critical temperature (Tc) of the dense fluid (48). During application of the liquid carbon dioxide solvent over a period of time (50), the substrate surface having a starting temperature (62) will fall (64) and reach a second equilibrium temperature (66) equilibrium at some point during the application time (50). This rate of decrease and final equilibrium temperature is determined by the rate of heating the substrate. Under these conditions, the liquid carbon dioxide is continuously changing phase from liquid to supercritical state with the substrate. However if the substrate is not actively heated and starts under the conditions of Ts>Tc, and as the liquid carbon dioxide continues to bathe the substrate, the substrate temperature will decrease in temperature (68) until it reaches an equilibrium temperature (70) with the liquid carbon dioxide solvent. Once the temperature of substrate decreases to or below the critical temperature of the dense fluid (48), the solvent will remain as a liquid phase following contact with the substrate surface.

Figure 4A:
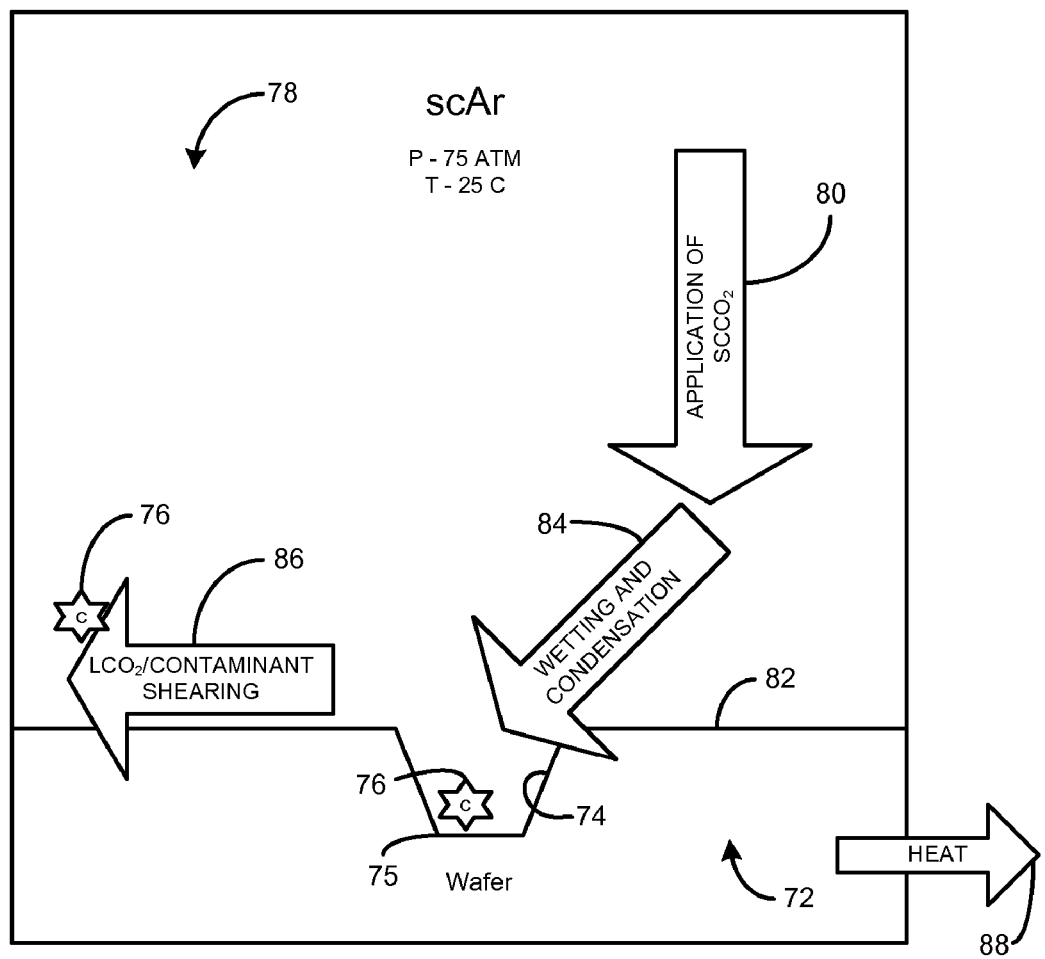
FIG. 4a—Exemplary graphic describing selective critical fluid condensation shear cleaning phenomenon for the supercritical-to-liquid substrate surface transition.
Figure 4B:
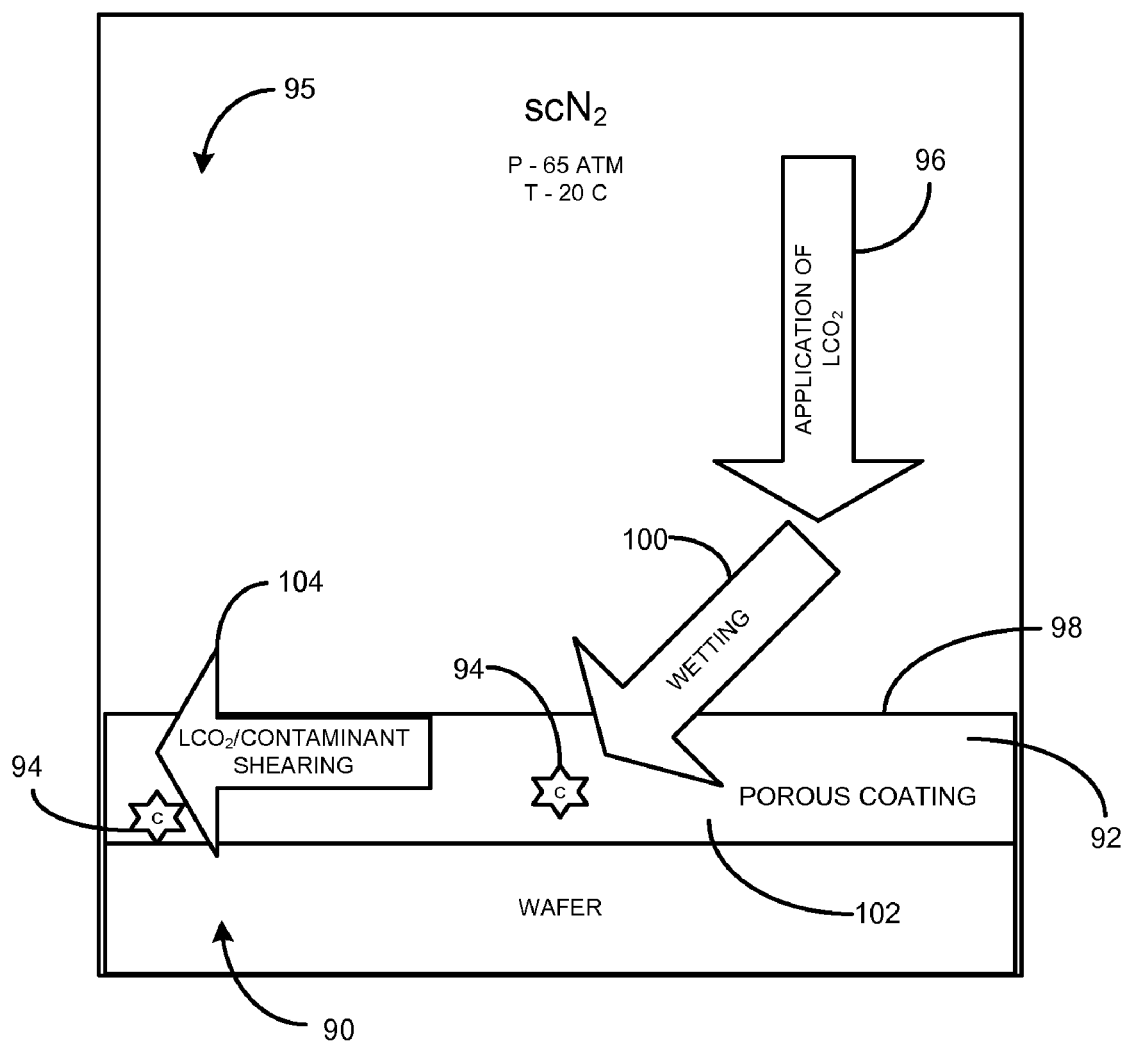
FIG. 4b—Exemplary graphic describing selective critical fluid condensation shear cleaning phenomenon for the liquid-to-liquid substrate surface transition.
Figure 4C:
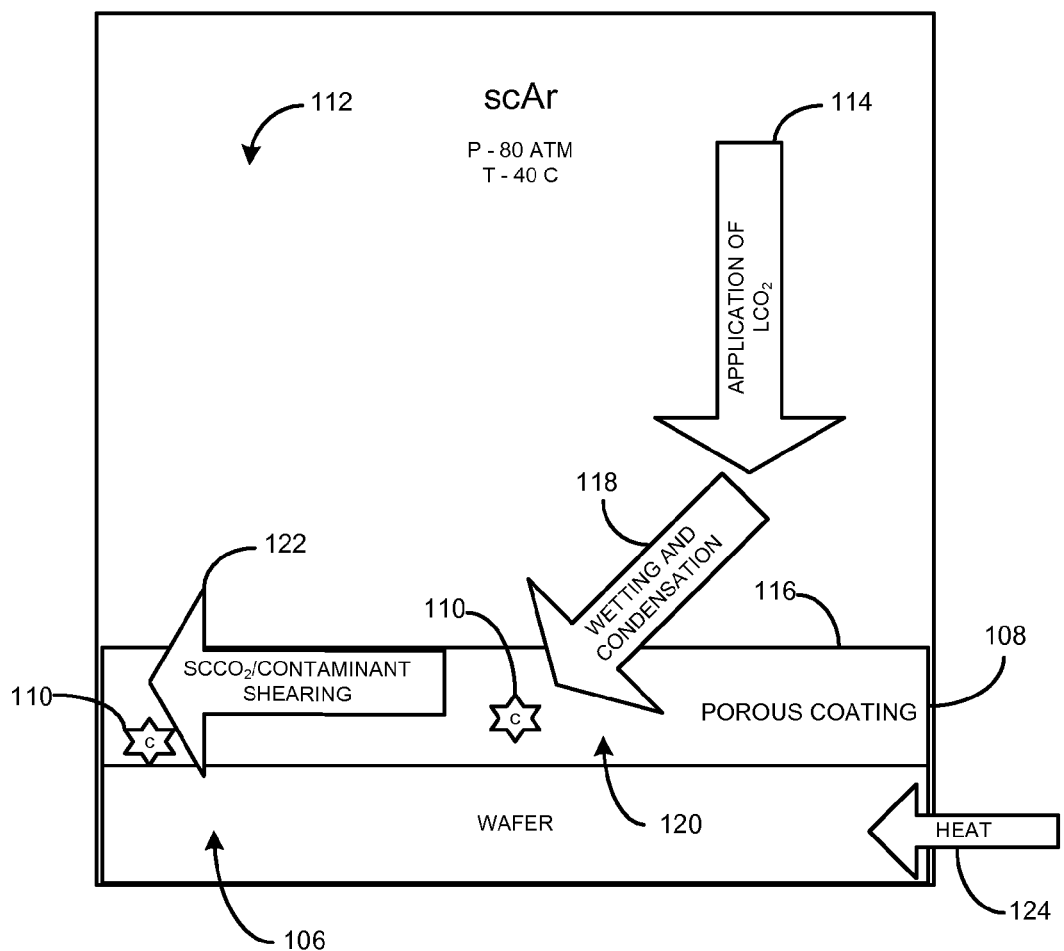
FIG. 4c—Exemplary graphic describing selective critical fluid condensation shear cleaning phenomenon for the liquid-to-supercritical substrate surface transition.

FIGS. 4a, 4b and 4c are graphics showing exemplary mechanisms involved with selective condensation shear cleaning.

Referring to FIG. 4a, an exemplary substrate semiconductor wafer (72) containing a microvia structure (74) and a contaminant (76) therein is contained within a supercritical argon processing atmosphere (78) at 75 atm and 25 C. Supercritical carbon dioxide (80) is applied over the substrate surface (82) which spontaneously spreads and condenses (84) over the substrate surface (82), filling the exemplary microvia structure (74), and causing a shear stress force and change in cohesion energy to be developed at the substrate surface-contaminant interface (75), entrains or dissolves the contaminant (76) contained therein. Under the shear stress induced by the condensing fluid flow and/or centripetal force (if the substrate is rotating about an axis), the condensed liquid phase and entrained or dissolved contaminant (86) and is separated from the substrate surface (82). To maintain the continuous condensation shear cleaning action thus described, the substrate may be rotated about an axis at an angular velocity of between 10 and 5000 rpm and heat (88) is continuously extracted from the substrate (72) or substrate surface (82).

Referring to FIG. 4b, an exemplary substrate semiconductor wafer (90) containing a low-k porous film (92) and a contaminant (94) therein is contained within a supercritical nitrogen processing atmosphere (95) at 65 atm and 20 C. Liquid carbon dioxide (96) is applied over the substrate surface (98) which spontaneously penetrates and wets (100) the substrate surface (98), filling the exemplary porous film (92), and causing a shear stress force and change in cohesion energy to be developed at the substrate surface-contaminant interface (102), entrains or dissolves the contaminant (94) contained therein. Under the shear stress induced by the condensing fluid flow and/or centripetal force (if the substrate is rotating about an axis), the liquid phase with entrained or dissolved contaminant (104), is separated from the substrate surface (98) and porous film (92). To maintain the continuous shear cleaning action thus described, the substrate may be rotated about an axis at an angular velocity of between 10 and 5000 rpm.

Referring to FIG. 4c, an exemplary substrate semiconductor wafer (106) having a porous coating (108) entraining a contaminant (110) therein is contained within a supercritical argon processing atmosphere (112) at 80 atm and 40 C. Liquid carbon dioxide (114) is applied over the substrate surface (116) which spontaneously penetrates, spreads and changes phase (118) over the substrate surface (116), filling the exemplary porous coating (108) with supercritical carbon dioxide, and causing a shear stress force and change in cohesion energy to be developed at the substrate surface-contaminant interface (120), entrains or dissolves the contaminant (110) contained therein. Under the shear stress induced by the supercritical fluid flow and/or centripetal force (if the substrate is rotating about an axis), the solvent phase with entrained or dissolved contaminant (122) is separated from the substrate (106). To maintain the continuous and selective phase change cleaning action thus described, the substrate may be rotated about an axis at an angular velocity of between 10 and 5000 rpm and heated (124) continuously at the substrate (106) or substrate surface (116).

Having thus described the exemplary condensation shear cleaning mechanisms, following is a discussion of an exemplary condensation shear deposition mechanism.

Figure 5:
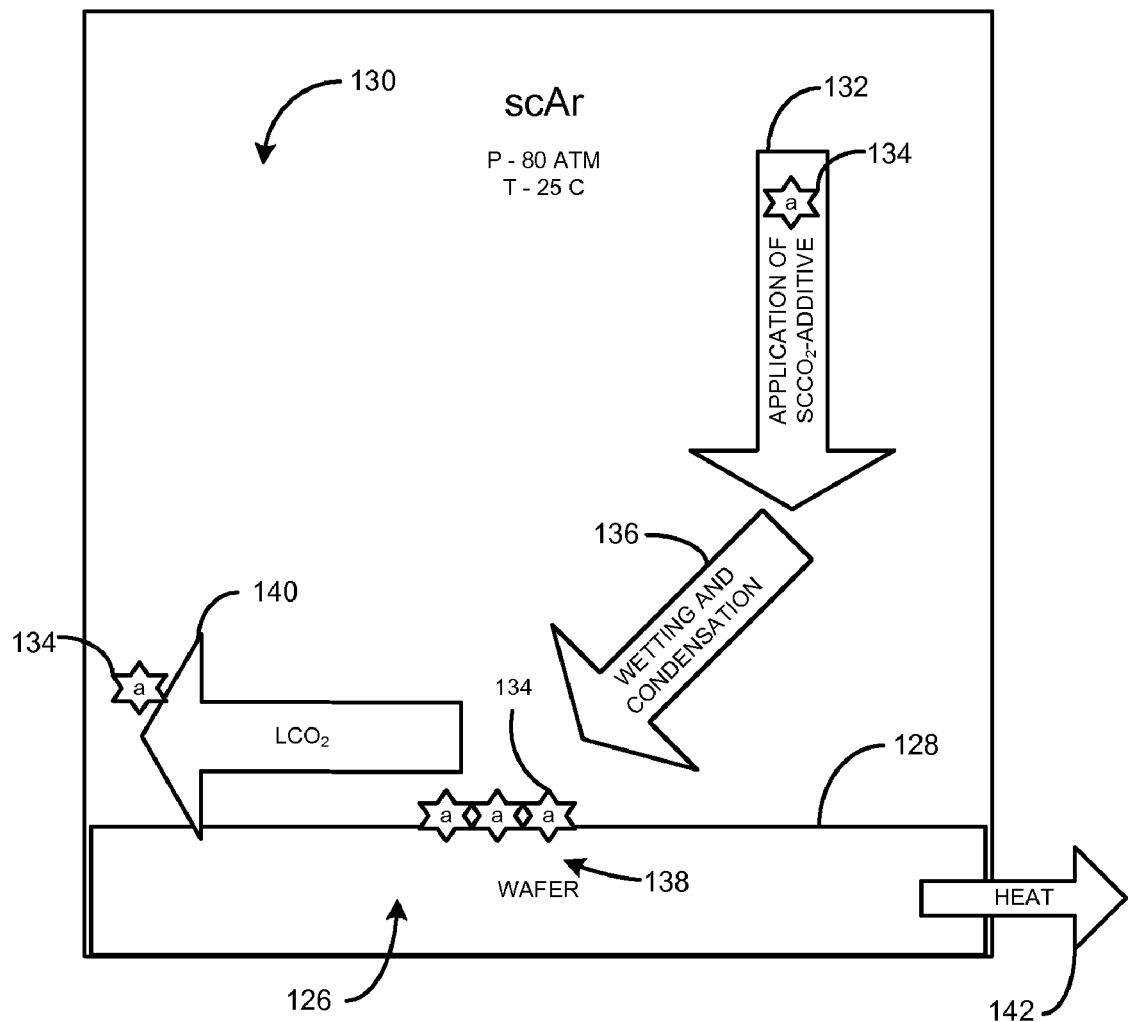
FIG. 5—Exemplary graphic describing the selective critical fluid condensation shear deposition phenomenon.

Referring to FIG. 5, an exemplary substrate semiconductor wafer (126) having a cleaned, treated or otherwise modified substrate surface (128), which may have been produced using one or more of the cleaning methods described in this invention, is contained within a supercritical argon processing atmosphere (130) at 80 atm and 25 C. Supercritical carbon dioxide (132) containing an deposition compound or agent (134) is applied over said substrate surface (128) which spontaneously spreads and condenses (136) over the substrate surface (128), causing a shear stress force and change in cohesion energy to be developed at the substrate surface-deposition compound interface (138), causing the entrained or dissolved deposition compound (134) to deposit onto the substrate surface (128). Under the shear stress induced by the condensing fluid flow and/or centripetal force (if the substrate is rotating about an axis), the condensed liquid phase and remaining fraction of entrained or dissolved deposition compound (140) is separated from the substrate (126). To maintain the continuous condensation shear deposition action thus described, the substrate may be rotated about an axis at an angular velocity of between 10 and 5000 rpm and heat (142) is continuously extracted from the substrate (126) or substrate surface (128).

Having thus described the exemplary condensation shear cleaning and deposition mechanisms, following is a discussion of selective control of both shear stress and cohesion energy at dense fluid solvent-substrate surface interfaces.

Figure 6A:
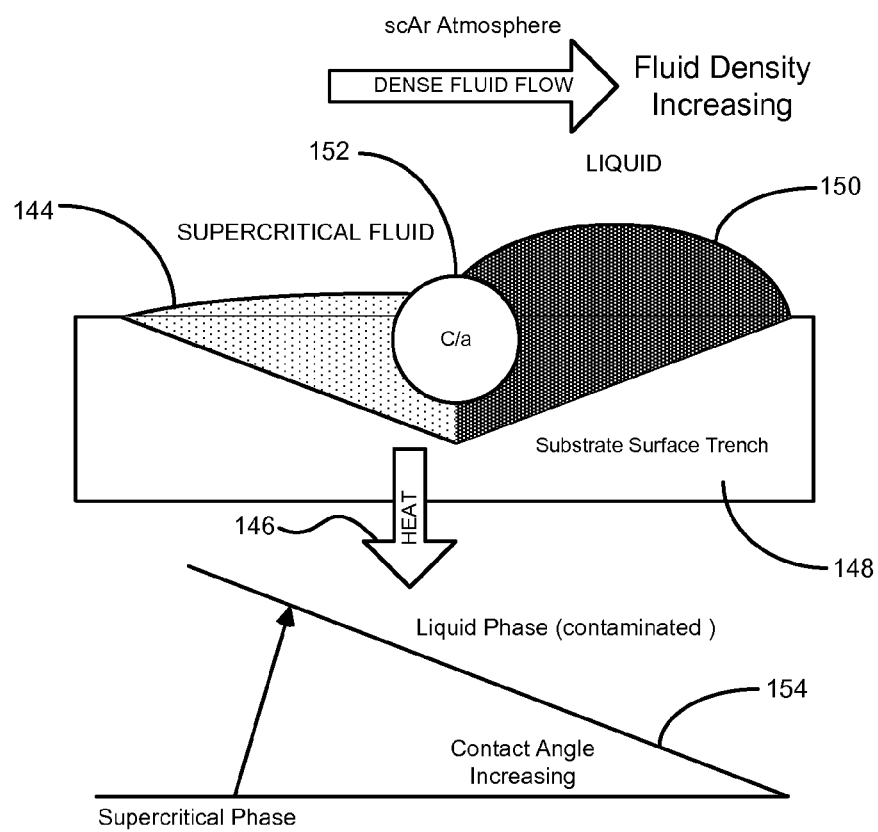
FIG. 6a—Exemplary graphic describing drag forces exerted on a substrate surface during condensation shearing phenomenon for a supercritical-to-liquid phase transition.
Figure 6B:
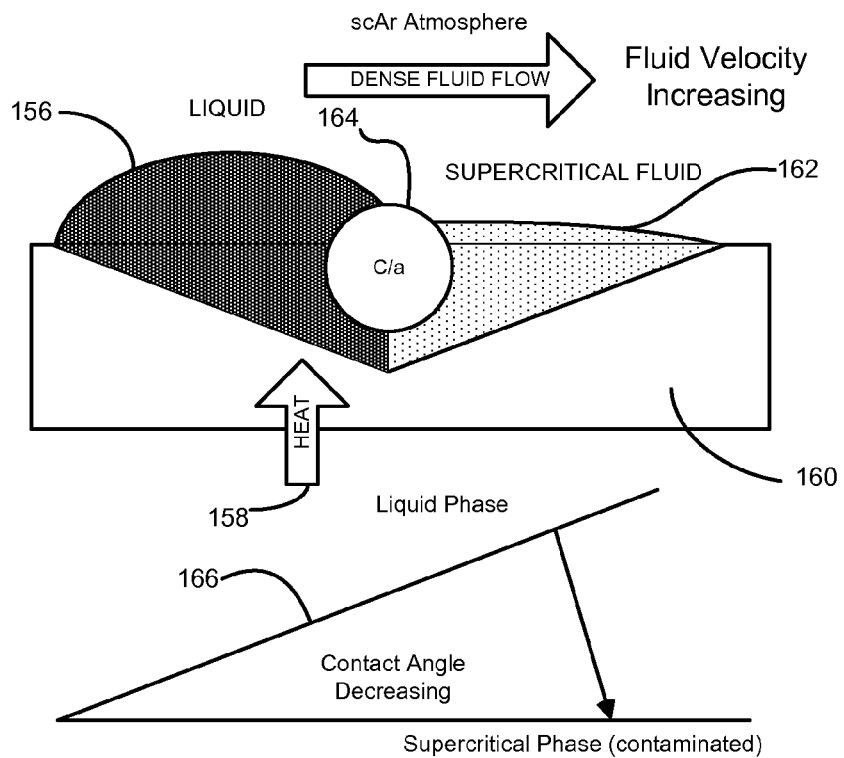
FIG. 6b—Exemplary graphic describing drag forces exerted on a substrate surface during condensation shearing phenomenon for a liquid-to-supercritical fluid phase transition.

FIGS. 6a and 6b show schematically, the influence on drag force for a supercritical-to-liquid phase and a liquid-to-supercritical phase transitions, respectively.

Referring to FIG. 6a, an advancing stream of supercritical fluid (144) transfers heat (146) to a substrate surface (148) which, according to FIG. 2, causes the supercritical fluid (144) to condense to liquid carbon dioxide (150). Small contaminant or deposition compound particles (152) experience an increasing shear stress due to an approximately two-fold increase in fluid density.($\rho$). Also, the free stream contact angle (154) is increasing which exerts an additional removal force on a surface particle. Moreover, an advancing and increasing contact angle aids in physical separation of liquids such as water from a substrate surface, in essence lifting a residue from the substrate surface.

Referring to FIG. 6b, an advancing stream of liquid phase solvent (156) extracts heat (158) from a substrate surface (160) which, according to the FIG. 3, causes the liquid phase solvent (156) to change phase to a supercritical fluid solvent (162). Small contaminant or deposition compound particles (164) experience an increasing shear stress due to an decrease in fluid viscosity.($\mu$), which increases local fluid velocities (V). Also, the free stream contact angle (166) is decreasing which exerts an additional removal force on a surface particle. Moreover, an advancing and decreasing contact angle aids in physical separation of liquids such as particles from a substrate surface, in essence pushing a residue along the substrate surface.

Figure 7A:
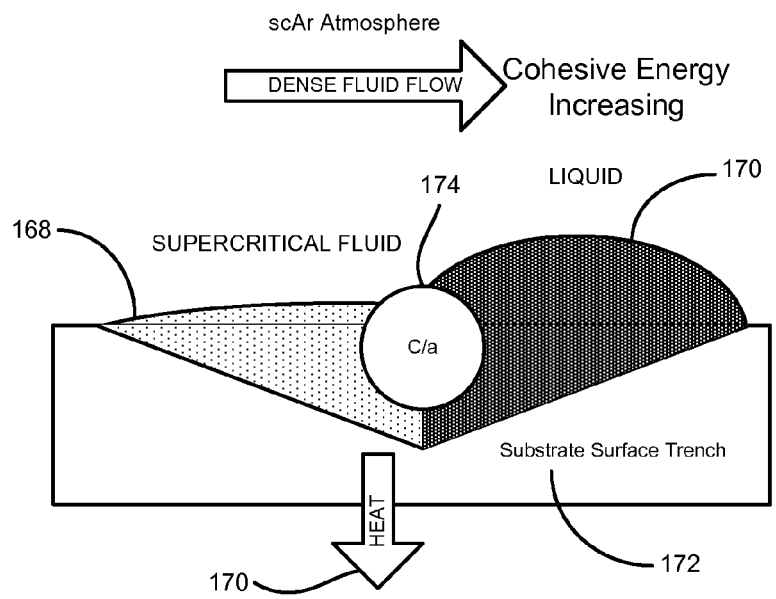
FIG. 7a—Exemplary graphic describing selective alteration of cohesive energy of dense fluid during condensation shearing for a supercritical-to-liquid phase transition.
Figure 7B:
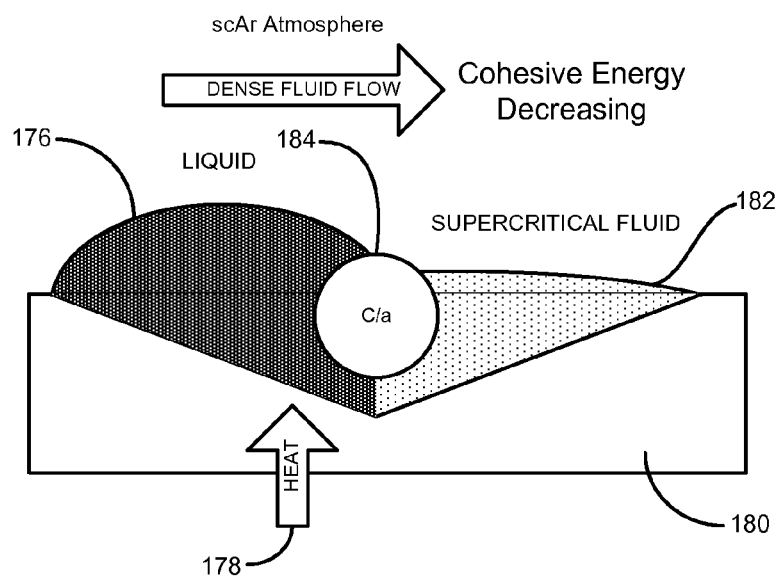
FIG. 7b—Exemplary graphic describing selective alteration of cohesive energy of dense fluid during condensation shearing for a liquid-to-supercritical phase transition.

FIGS. 7a and 7b show schematically, the influence on cohesion energy for a supercritical-to-liquid phase and a liquid-to-supercritical phase transitions, respectively.

Referring to FIG. 7a, an advancing stream of supercritical fluid (168) transfers heat (170) to a substrate surface (172) which causes the supercritical fluid (168) to condense to liquid carbon dioxide (170). Small contaminant or deposition compound particles (174) experience an increase in solvent cohesion energy ($\delta$). An increase or decrease in the solubility of the particle (174) in the dense gas solvent will be produced depending upon the differences between the cohesion energy of the gas solvent (170) and contaminant-deposition compound particle (174). Moreover, substrate surface (172) coatings (not shown) may be affected, for example they may experience an increase or decrease in interaction (i.e., penetration or swelling) with the dense gas solvent (170) due to a dramatic change in cohesion energy.

Referring to FIG. 7b, an advancing stream of liquid phase solvent (176) absorbs heat (178) from a substrate surface (180) which causes the liquid phase solvent (176) to change phase to a supercritical fluid solvent (182). Small contaminant or deposition compound particles (184) experience a decrease in solvent cohesion energy ($\delta$). An increase or decrease in the solubility of the particle (184) in the dense gas solvent will be produced depending upon the differences between the cohesion energy of the gas solvent (182) and contaminant-deposition compound particle (184). Moreover, substrate surface (180) coatings (not shown) may be affected, for example they may experience an increase or decrease in interaction (i.e., penetration or swelling) with the dense gas solvent (182) due to a dramatic change in cohesion energy.

Figure 8A:
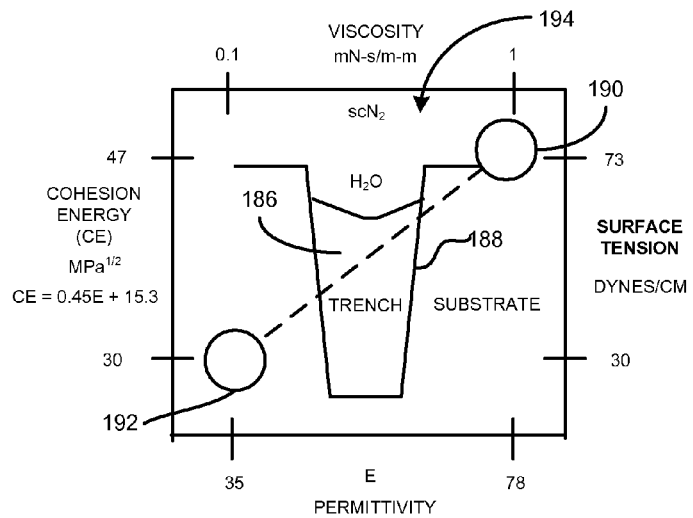
FIG. 8a—Exemplary diagram showing the relationship between permittivity, cohesion energy, viscosity, and surface tension for water (exemplary contaminant) within a supercritical nitrogen anti-solvent processing atmosphere.
Figure 8B:
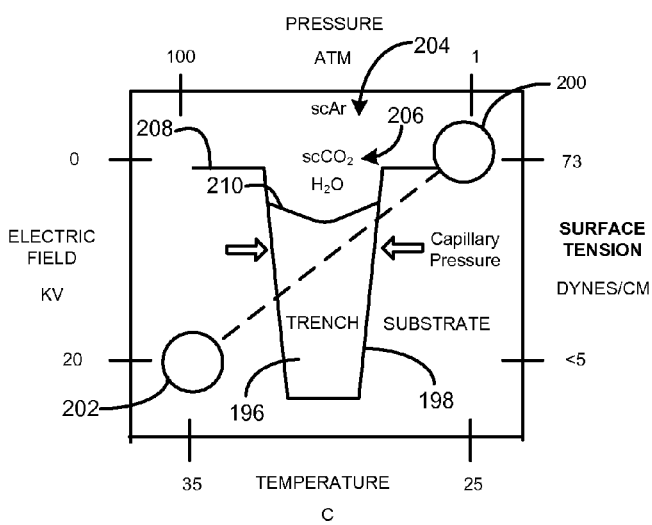
FIG. 8b—Exemplary diagram showing the relationship between electric field strength, pressure, temperature and surface tension for water (exemplary contaminant) exposed to a dense fluid carbon dioxide solvent.
Figure 8C:
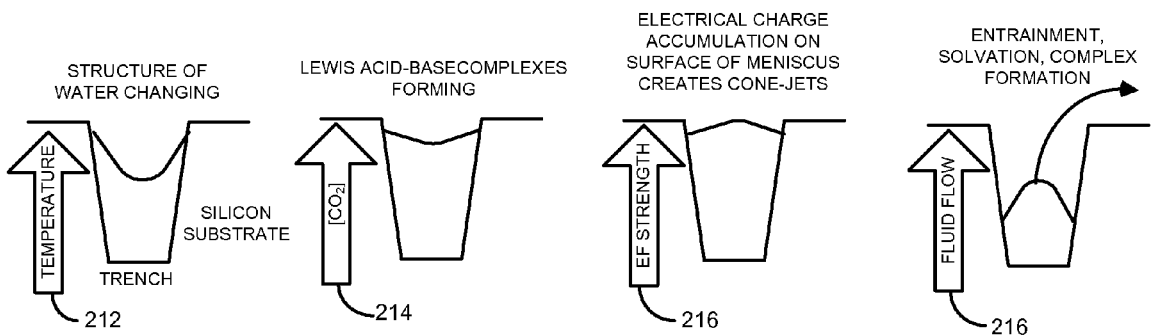
FIG. 8c—Exemplary diagram showing the synergistic mechanisms employed in the present invention to enhance the precision drying of a substrate surface.

With reference to FIGS. 8a, 8b and 8c, following is a discussion of various other physical and chemical mechanisms of the present invention which, besides exemplary removal mechanisms discussed above, enhance the removal of polar substrate contaminants such as liquid water. Water is a common contaminant found on substrate surfaces. As discussed herein, water is a by-product of plasma reactions and is always present in microscopic quantities in microvias or between microscopic structures following deionized water rinsing and nitrogen drying operations. Moreover, water is present in varying degrees in the atmosphere and is readily condensed or adsorbed onto substrate surfaces. The present invention is particularly suited to performing precision drying to remove polar liquid contaminants such as water and alcohols.

Referring to FIG. 8a, liquid water, although not highly soluble in carbon dioxide from a cohesion energy perspective, can be altered to enhance its solubility in non-polar dense fluid solvents. Heating liquid water (186) trapped in a capillary (188) from 25 C and 1 atm (190) to 250 C and 100 atm (192), while steadily increasing the vapor pressure using a supercritical nitrogen atmosphere (194) to maintain liquid phase, causes profound changes in the physicochemistry of water. Water's structure is changed which is exhibited as lower cohesion energy, from 47 MPa1/2 to approximately 30 MPa1/2. Moreover, surface tension decreases from 73 dynes/cm to 30 dynes/cm and permittivity decreases from 78 to 35. Finally, viscosity decreases from approximately 1 mN-s/m2 to less than 0.2 mN-s/m2. In effect, the liquid water trapped within the capillary is exhibiting a chemistry similar to a mixture of methanol and water. Thus, water solubility in a dense fluid solvent may be increased by increasing both the pressure and temperature of the anti-solvent phase.

Referring to FIG. 8b, an investigation of the effect of carbonating superheated water using the exemplary isobaric dense fluid and plasma cleaning processes herein reveals that the cohesion energy of water can be further altered to enhance its solubility in a non-polar dense fluid solvent phase. Moreover, research suggests that a strong electric field, present when using high pressure plasma processes herein, can have a profound effect on the surface tension of liquid water. Selective carbonation of trace liquid water (186) trapped in a capillary (198) from 25 C and 1 atm (200) to 35 C and 100 atm (202), while steadily increasing the vapor pressure using a supercritical argon atmosphere (204) to maintain liquid phase, causes profound changes in the physicochemistry of water. As discussed herein, dense fluid solvent phase, in this case supercritical carbon dioxide (206), may be selectively contacted with the substrate surface (208) while maintained under supercritical anti-solvent pressure and temperature conditions. Water's structure is selectively changed when the supercritical carbon dioxide (206) penetrates and reacts with the water (196), for example forming Lewis acid-base complexes. This is exhibited as lower surface tension, which decreases from 73 dynes/cm to <35 dynes/cm due to high pressure carbonation alone. Note that pressurizing water with gases such as helium, nitrogen and argon do not produce an equivalent and beneficial change in water's properties. Finally, the presence of a strong electric field, created by the plasma processes of the present invention, produces electric charges on the surface film of water (210), which reduces the surface tension of water to less than 5 dynes/cm, depending upon the strength of the electric field. In effect, carbonated and electrified liquid water trapped within the capillary is exhibiting properties similar to a supercritical fluid. Thus, polar liquid contaminant solubility in a non-polar dense fluid solvent may be increased by selectively contacting the polar liquid with a more reactive dense fluid (i.e., carbon dioxide) and can be further increased by simultaneously applying an electric field or super-atmospheric plasma to the substrate surface.

Thus referring to FIG. 8c, a polar contaminant such as water can be selectively modified to enhance its solubility in a non-polar dense fluid solvent phase by increasing temperature (212), using a more reactive dense fluid such as supercritical or liquid carbon dioxide (214), applying an electric field of several thousand volts (216). Moreover, a small amount of polar additive such as methanol may be added to the dense fluid, or alternatively the substrate surface may be doped with a polar additive, prior to dense fluid extraction processes herein.

Having thus described the exemplary condensation shear cleaning and deposition mechanisms with consideration given to optimizing contaminant separation, following is a discussion of exemplary mechanical apparatus for use with the present invention.

Figure 9:
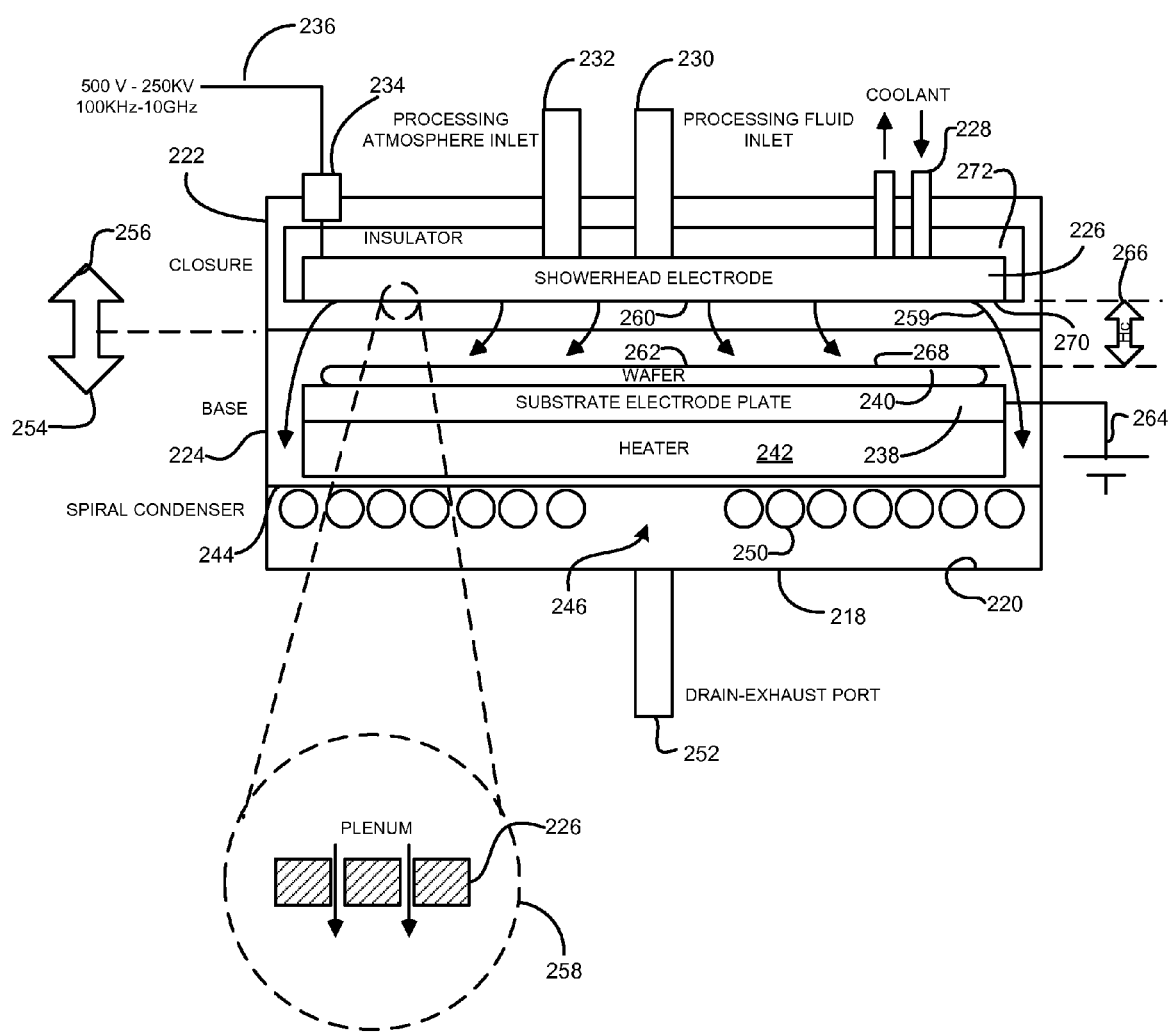
FIG. 9—Exemplary diagram showing a dense fluid showerhead reactor.

FIG. 9 is a cut-away graphical side view of exemplary components and integration scheme for constructing a dense fluid showerhead reactor for performing the methods and processes of the present invention. Referring to FIG. 9, the exemplary reactor comprises a pressure vessel (218) constructed for example of stainless steel, for which the interior surfaces (220) exposed to supercritical fluid anti-solvent, dense fluid solvent and plasma energy, may be alternatively coated or lined with various protective materials including silica, glass, fluorocarbon coating, ceramics and anodized aluminum. The exemplary reactor pressure vessel is constructed to have interlocking closure (222) and base (224) sections. The closure section (222) may house an insulated plasma showerhead (226), which may contain coolant lines (228) or an active showerhead electrode heating and cooling system (not shown), a dense fluid solvent inlet line (230), a supercritical fluid anti-solvent inlet line (232), and a sealed high voltage electrode assembly (234) designed specifically for conveying high voltage electricity into pressure or vacuum chambers (supplier: Conax Buffalo, Buffalo, N.Y.). The exemplary electrode (234) communicates a high frequency and high voltage energy to the exemplary showerhead electrode (226) using a solid or coaxial conductor (236). The reactor base section (224) may house a grounded plate (238) onto which a substrate such as a semiconductor wafer (240) is mounted. Below the plate (238) is a heating element (242) which is used to heat the plate (242), which in turn heats the exemplary substrate (240). Alternatively, and not shown in the figure, the heated electrode plate system thus described may be replaced with a temperature controlled electrode plate to provide either heating or cooling for performing various aspects of the present invention. Below the exemplary heater (242) is placed a circular and perforated attenuation plate (244) which separates a condensation zone (246) from a reaction zone (248). Within the condensation zone (246) is placed an exemplary spiral condenser coil (250) or other cooling device (i.e., thermal electric cooler). Finally, the exemplary reactor contains an exhaust or drain port (252) which is used to convey purge gases, evacuated atmospheres, spent dense fluid solvents and additives, reaction by-products, and supercritical fluid anti-solvent from the reactor. The exemplary closure (222) may be connected (254) and disconnected (256) to the exemplary base section (224) using an actuator and locking mechanism (both not shown). Moreover, the exemplary showerhead electrode (226) may be perforated (258) to provide an even flow (259) of dense fluid solvent and supercritical fluid anti-solvent atmosphere over the substrate (240) or the dense fluid inlet pipe (230) may be fed through the center of the electrode (260). A perforated showerhead would be useful for substrates which are fixed to heated manifold as shown. A centralized dense fluid inlet pipe configuration would be useful for depositing a quantity of dense fluid onto the centermost portion of a substrate surface (262) which is rotated about its axis using a spin processor (not shown). In either case, the supercritical fluid anti-solvent inlet line (232) may be used with a perforated electrode as described herein.

Moreover, the electrode (226) may be coated with a dielectric barrier material such as Teflon or ceramic, or as a novel aspect of the present invention may be an uncoated stainless steel with the exemplary supercritical fluid anti-solvents and dense fluid solvents as used herein acting as a dielectric barrier material. Thus a number of planar and cylindrical dielectric barrier discharge configurations, and hence plasmas, are possible with the present invention.

An earth ground connection (264) to the substrate mounting plate electrode (238) completes the circuit necessary to establish a working plasma within the reactor. The distance (266), denoted as Hc herein, between the substrate surface (268) and the bottom surface of the showerhead electrode (270) is critical as it relates to plasma energy density, electric field strength, deposition phenomenon and cleaning phenomenon associated with the present invention. As such, Hc may be adjusted to have a value of 1 mm to virtually any distance desired and required for a particular substrate or substrate electrode configuration. Finally, the showerhead electrode (226) should be completely sheathed (272) in an electrical insulation material such as a fluorocarbon polymer or ceramic such as aluminum oxide to prevent spurious electrical discharges to the reactor walls. Moreover, the dense fluid solvent line (230), supercritical fluid anti-solvent (232) fluid and coolant line (228) connections to the showerhead electrode should be made using non-conducting and non-contaminating tube materials such as fluorocarbon or polyetheretherketone (PEEK). A more general discussion of the important aspects of the design and operation of the exemplary dense fluid reactor follows.

Figure 10:
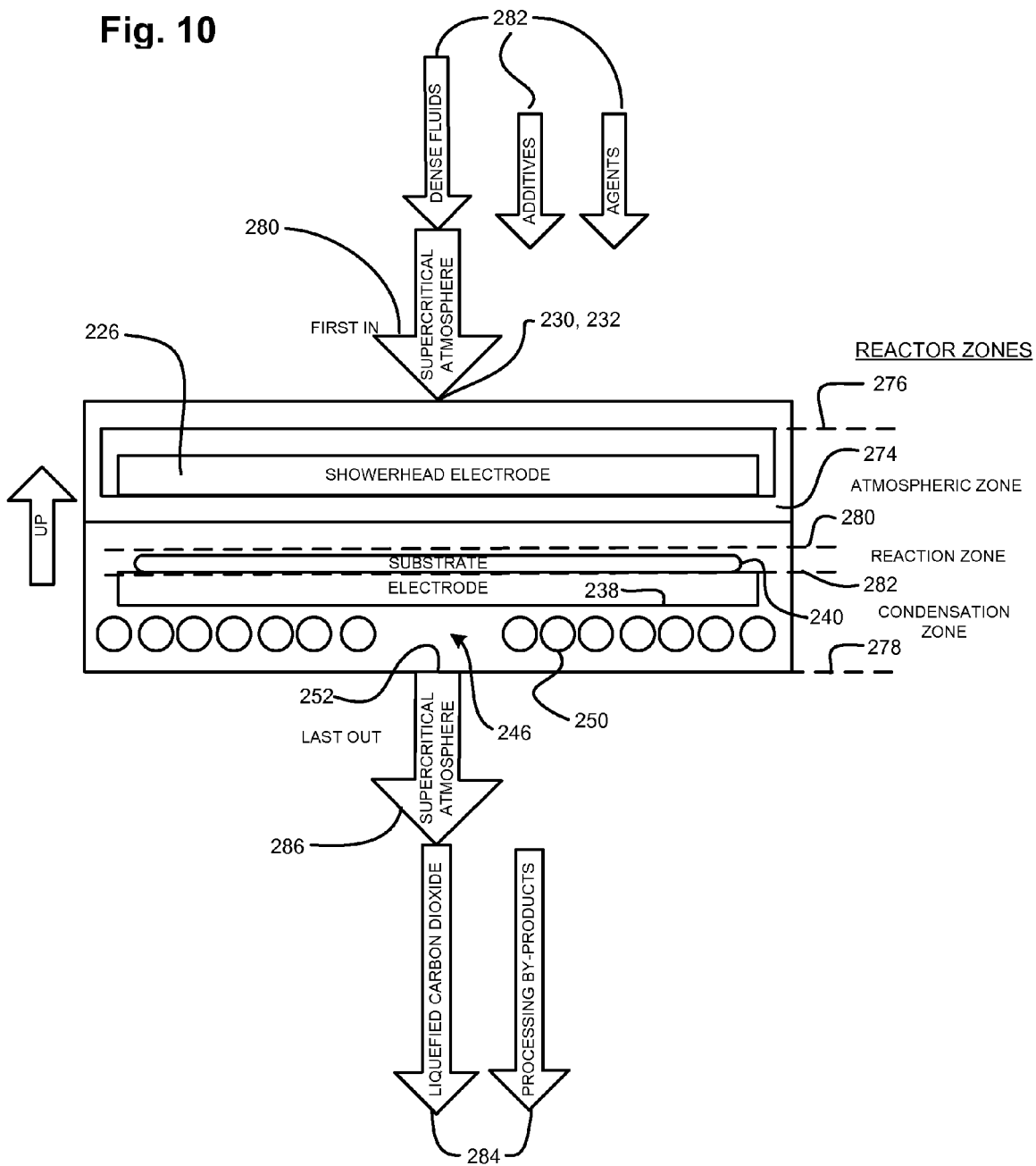
FIG. 10—Exemplary dense fluid reactor zones.

Plasma showerhead reactors such as the exemplary reactor of FIG. 10 employ a perforated or porous planar surface to dispense reactant gases more-or-less uniformly over a second parallel planar surface. Such a configuration can be used for batch processing of multiple substrates, but also lends itself to processing of single round wafers. Wafers can be heated separately from the dense fluid dispense and reactor chamber wall, so dense fluid showerhead reactor may be a cold-wall: only the fixture surface holding the substrate need be at the process temperature. This fact is often helpful in keeping the substrate cleaner during spray cleaning operations herein. Coolant may be provided to help in controlling the temperature of the showerhead. Many conventional deposition processes employ precursors which can exist as liquids at room temperature (TEOS and related organosilanes and siloxanes, TDEAT and TDMAT, most copper precursors, WF6, etc.). When working with such materials it is often useful to warm the walls of the chamber above ambient temperature to avoid any possibility that the precursors may condense on the walls or inside the showerhead plenum. The top and bottom electrodes may be constructed to be about the same size. Note that if one wishes to ground the wafer electrode, which is often convenient for safety and wafer loading, the showerhead has RF power applied: it is then necessary to incorporate appropriate insulating sections in the gas supply system, to avoid creating a parasitic discharge in the gas feed lines to the chamber.

The diameter of a showerhead reactor is determined by the size of the wafer or substrate batch to be processed; in particular, single-wafer reactors usually employ a bottom electrode similar in size to the wafer.

A very important chamber design parameter is the ceiling height or electrode gap, which is denoted as Hc in FIG. 9. As noted above, changes in Hc can have important effects on the plasma density and potential. This is extremely important in optimizing Hc for a particular pressure. As noted herein, as pressure within the reactor increases, an increase in voltage is required to ignite a plasma. As such, the distance of Hc may be decreased or the voltage increased.

Finally, changing Hc is often important in controlling the radial uniformity of the deposited film thickness. For all these reasons it is useful to be able to change Hc easily during process development, either through simple hardware changes or by providing adjustable mounting of the substrate electrode.

The fluid hole configuration of the perforated showerhead is often important in determining, for example, uniformity of deposition and plasma plume. It is therefore useful to design the showerhead so that the perforated faceplate is easily removed and another of possibly different design substituted. Changes in the plenum, such as the addition of blocking plates or changes in the gas inlet configuration, can also be used to improve uniformity. Operation at high dense fluid pressures requires that the holes be small, as otherwise a localized hollow cathode discharge may occur in the holes, causing localized heating and erosion. Although not shown in the FIG. 9, electrode configurations may include stainless steel or aluminum electrodes with a perforated dielectric barrier material such as a clean ceramic membrane sandwiched against the metal surface. The ceramic may contain capillary gas channels which produce plasma jets when a dense fluid or atmospheric fluid is jetted through the capillary channel when plasma power is applied to the metal plate above.

It is always necessary to be able to access the chamber area for cleaning and maintenance. As such, the showerhead reactor should be configured with a lift or hinge, so that the showerhead may be lifted away from the process reactor vessel. A design option is to introduce dense fluids and gases into the process chamber to one or more holes in the faceplate where the top and bottom seal together: a small o-ring mounted around the holes allows a corresponding hole in the top plate to form a sealed passage for gas supplies when the chamber is assembled, without impeding disassembly. The consequent "dead space" between the sealing faces within the o-ring formed when the chamber is reassembled must be carefully purged before processing if moisture-sensitive processes are to be performed.

Having thus described the exemplary dense fluid reactor for use with certain aspects of the present invention, following is a more generalized discussion of the design aspects of the exemplary apparatus of FIG. 9.

FIG. 10 graphically shows various reactor zones created when constructing and using the exemplary apparatus of FIG. 9. Shown in the figure are the various major components discussed in FIG. 9. These include dense fluid inlet ports (230,232), showerhead electrode (226), substrate (240), substrate electrode/fixture (238), cooling coils (250), and discharge port (252). Placement of the various components as shown creates three distinct and purposeful reactor zones. An atmospheric zone (274) is created in the reactor which extends from the interior and topside surface of the reactor (276) to the lower interior surface of the reactor wall (278). The atmospheric zone of the present invention may have a pressure of between 100 mTorr and 250 atm, a temperature of between 10 C and 300 C, and is generally behaving as a non-solvent reaction environment.

A reaction zone (248) is created which extends the area bounded between the substrate surface (280) to the top of the grounded substrate electrode surface (282). The reaction zone is a centralized portion of the atmospheric zone which contains the dense fluid solvent and processing plasma which is selectively applied to a substrate surface, and is generally held at a temperature which is less than, equal to or greater than the atmospheric zone (274). Another aspect of the present invention is that the grounded electrode (238) may be a perforated metal surface which is positioned above the exemplary substrate (240)—not shown in FIG. 10. This is a downstream configuration wherein the substrate (240) is not present within the plasma sheath or glow discharge zone. This may be beneficial if the substrate is susceptible to ion damage or if the substrate is to exposed to plasma-generated species such as oxygen radicals, ozone or supercritical ozone carried to a substrate by a dense fluid. In either case, the plasma may be applied in a pulsed or continuous operation at a frequency of between 100 KHz and 10 GHz, and voltages of between 50 and 5000 volts. Also, either a DC or AC source may be used for power.

The condensation zone is created in the reactor which extends from the top of the of the grounded substrate electrode (282) to the bottom interior surface (278) of the reactor. The condensation zone (246) is the bottommost portion of the atmospheric zone (274) and is maintained at a temperature which is generally less than the upper and middle hemispheres of the atmospheric zone (274).

Establishing reactor zones are necessary to perform condensation shear cleaning and deposition aspects of the present invention, as well as plasma-aided adjuncts thereto. Moreover, an important and novel aspect of the present invention is to maintain the integrity of the substrate once cleaned, coated or otherwise treated in accordance with methods described herein. Compartmentalizing or segregating the dense fluid reactor into distinct zones is accomplished using both thermal gradients as well as porous structures. Moreover, a judicious application of the dense fluid cleaning or deposition agents and solvents, usually at a fraction of the volume of the supercritical fluid anti-solvent processing atmosphere, prevents flooding the entire reactor with excess processing fluids and agents. Still moreover, the dense fluid flow is always from top to bottom to insure that contaminants are move away from both the processing atmospheric zone and reaction zone surrounding a treated substrate. Thus, a number of novel design considerations are combined to eliminate or minimize re-contaminating or otherwise spoiling the integrity of a treated substrate.

Again referring to FIG. 10, the exemplary method for constructing, employing, and de-constructing the exemplary reactor zones as described above is as follows:

(280) Introduce a supercritical fluid anti-solvent fluid such as supercritical helium, nitrogen, oxygen or argon through an inlet port which is located at the uppermost portion of a dense fluid reactor. Establish and maintain a pre-determined pressure and temperature.

(282) Selectively introduce and contact a substrate surface, which is centrally located within the dense fluid reactor and contained within same supercritical anti-solvent atmosphere, with a dense fluid solvent, additives and agents such as supercritical or liquid carbon dioxide, nitrous oxide or ammonia. A plasma or electric field may or may not be present during the application of said dense fluid solvent.

(284) Condense said dense fluid solvent in a condensation zone which is below said substrate surface and immediately remove said dense fluid through an outlet port which is located at the bottommost portion of the dense fluid reactor.

(286) Remove said supercritical fluid anti-solvent fluid from reactor through an outlet port which is located at the bottommost portion of the dense fluid reactor.

Figure 11A:
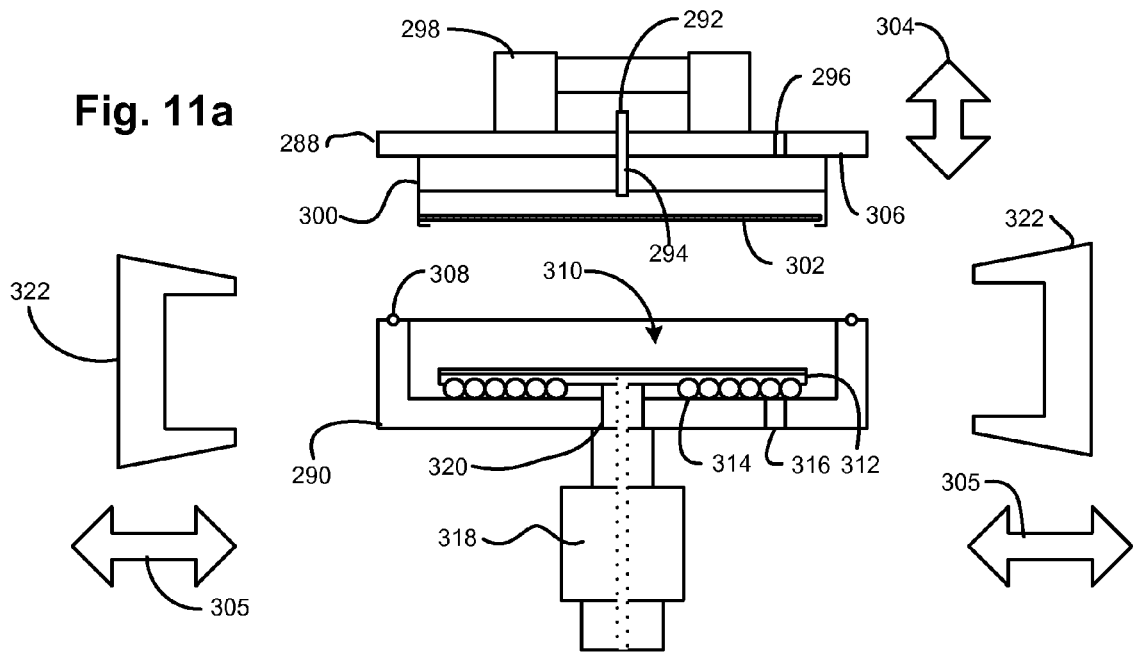
FIGS. 11a, 11b and 11c—Exemplary graphic showing a substrate loading, closure actuation, and locking sequences for an exemplary dense fluid spin processor reactor.
Figure 11B:
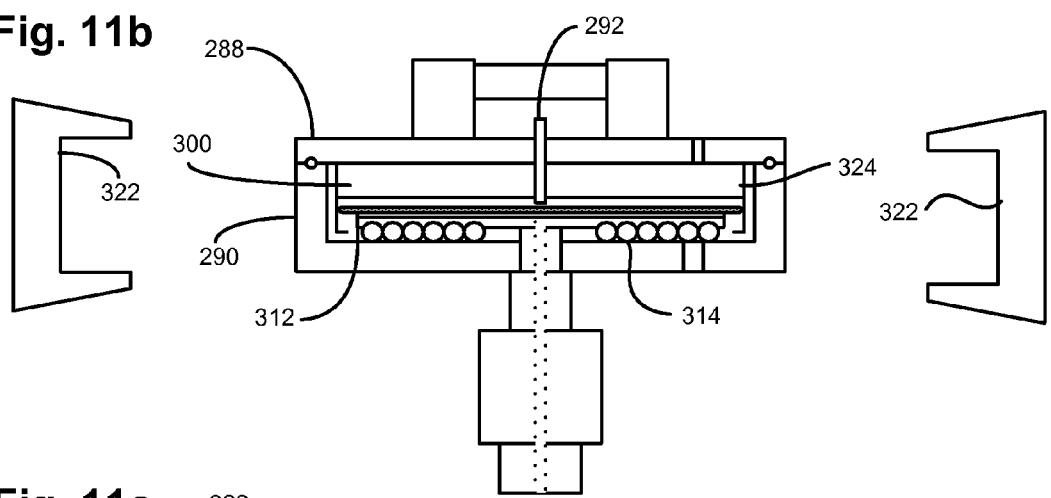
Figure 11C:
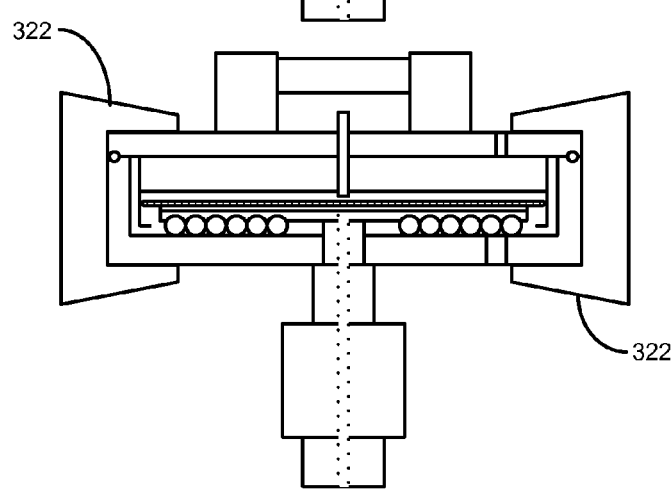

FIGS. 11a, 11b and 11c are schematic representation of an exemplary spin processor reactor for use with the present invention. The figures depict a novel substrate loading and spin processor mounting design as well as an exemplary locking mechanism.

Referring to FIG. 11a, an exemplary dense fluid spin processor reactor for use with the present invention comprises a high pressure stainless steel closure (288) and a stainless steel base (290). The closure (288) contains a centrally-located dense fluid inlet port and pipe (292), which extends (294) a distance down into the closure portion, and a supercritical fluid anti-solvent inlet port (296). The exemplary closure (288) also has a mounting and dismounting device (298) affixed to the topside of the closure as shown. The exemplary closure contains a substrate mounting fixture (300) which accepts, centers and holds an exemplary wafer substrate (302). As shown, the exemplary closure (288) is connected and disconnected with the base (290) using the mount and dismount device (298) in an up and down orientation (304). The closure contains a smooth and flat sealing surface (306).

The exemplary base contains a grooved sealing surface and fluorocarbon o-ring (308), for example Tefzel, E.I. Dupont, and a cavity (310) within which is placed a spin processor base (312), having a shape consistent with securely holding the substrate for a balanced high speed spin. For example a machined depression or vacuum may be employed using a round spin processor plate for a wafer substrate. Below the spin processor plate (312) is a spiral condensing coil (314) and an outlet port (316) is located below the condenser coil (314). A magnetic drive unit (318), available from Autoclave Engineers, Erie, Pa., is centrally connected to the bottom (320) of the base (290) and extends into the cavity (310) and is connected to the bottom of the spin processor plate (312) as shown. A motor (not shown) is attached to the magnetic drive and is controlled to rotate the spin processor plate (312) in a clockwise or counterclockwise direction and at a speed of between 10 and 5000 rpm.

Finally, locking rings (322) are used to mate and seal the closure (288) and base (290) sections of the exemplary dense fluid reactor. The locking rings may be moved along a horizontal motion (305) to seal and lock, and unseal and unlock the exemplary reactor. The interior surfaces of the exemplary closure and base may be coated with Teflon or lined with an anodized surface material to prevent corrosion if corrosive fluids are to be used.

Referring to FIG. 11b, the exemplary closure (288), with mounting fixture (300) and wafer substrate (302), is lowered against the base, mating the sealing surface of the closure (FIG. 11a, 306) with the sealing surface of the base (FIG. 11a, 308). During this process, the wafer substrate (302) lifts off and away from the mounting fixture (300) as the wafer comes to rest atop the spin processor plate (312). Also, the closure (288) has been designed so that the dense fluid inlet port (292) is positioned at a pre-determined distance from the topside and central portion of the exemplary substrate (302). Moreover, the mounting fixture cages the substrate (302) and may be designed to have a solid ring section (not shown) positioned circumferentially located at the upper portion (324) of the mounting fixture (300) which surrounds wafer in a barrier and which directs the dense fluid solvent downward toward the condensing coil (314) as its flows away from the substrate surfaces. Finally, as shown in the figure the exemplary locking rings (322) remain in an unlocked position away from the closure (288), as the closure is lowered to or raised from the base (290).

Referring to FIG. 11c, the exemplary dense fluid reactor is sealed and locked by sliding the locking rings (322) over the top and bottom sides of the connected closure and base sections forming a circumferential sealing clamp as shown. The dense fluid reactor is now ready for processing.

A variety of dense fluid reactors may be designed, constructed and used in accordance with the present invention. For example a plasma barreling apparatus may be constructed to perform bulk extraction of implantable devices wherein the substrates (i.e., silicone pump bodies) rotate in and out of a liquid carbon dioxide dense fluid solvent zone contained in a lower hemisphere of the reactor and up into an anti-solvent supercritical fluid or vapor plasma treatment zone in the upper hemisphere of the reactor. Moreover, pre- and post-process plasma treatments may be performed on dense fluid extracted substrates.

In another example, multiple wafers may loaded into a multi-ported mounting fixture, similar that as shown in FIG. 11a (300) and inserted into the reactor cavity. Moreover, the mounting fixture may be designed to have interlaced high voltage and grounding electrodes to perform plasma treatments described herein with the multiple wafers.

Having thus described the exemplary dense fluid reactor designs for use with various aspects of the present invention, following is a discussion of the entire dense fluid management system for producing and controlling the atmospheres and novel isobaric processing conditions present in the exemplary dense fluid reactor.

Figure 12:
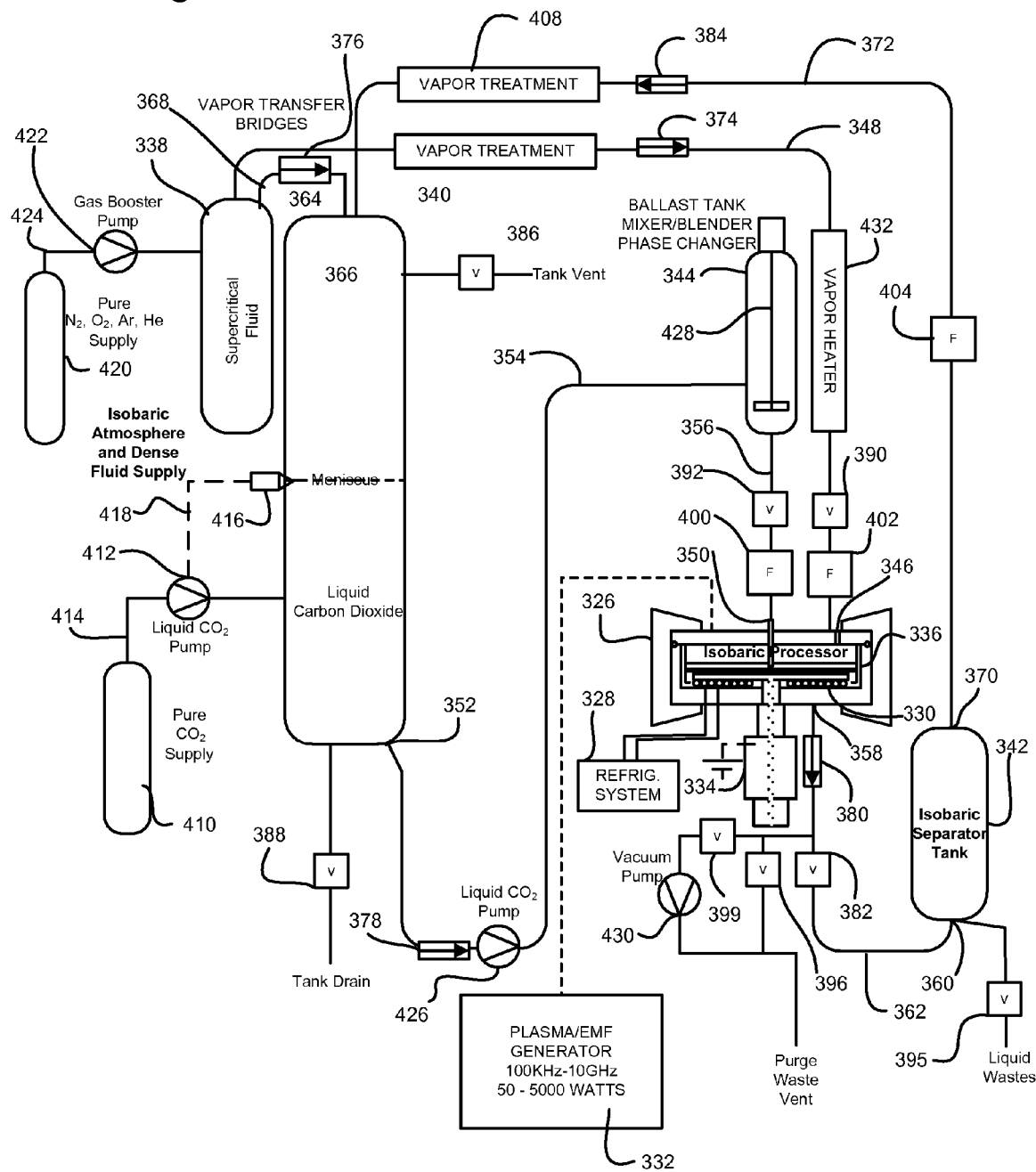
FIG. 12—Exemplary isobaric dense fluid delivery and management system.

FIG. 12 is an exemplary isobaric dense fluid management system for use with the present invention. Referring to FIG. 12, the exemplary dense fluid management system comprises an exemplary dense reactor (326) with its various connections shown including a refrigeration system (328) for the internal condensing coil (330), a high voltage generator (332) for delivering high frequency energy to the internal electrode (not shown), a grounded spin processor drive (334) to rotate the exemplary wafer substrate (336). Connected to the exemplary dense fluid reactor (326) are three pressure vessels or tanks; a supercritical fluid anti-solvent tank (338), a dense fluid solvent tank (340), and a dense fluid separation tank (342). Finally, a smaller ballast tank (344) may also be connected to the reactor.

Again referring to FIG. 12, the following exemplary tank and reactor connection scheme is required to establish reactor pressure and fluid conditions required to perform the various aspects of the present invention. The supercritical fluid anti-solvent inlet port (346) of the exemplary reactor is connected by a high pressure supercritical fluid pipe (348) to the topside of supercritical fluid tank (338). The dense fluid inlet port (350) of the exemplary reactor (326) is connected to a bottom port (352) of the dense fluid solvent tank (340) by a high pressure dense fluid pipe (354). The dense fluid connection pipe (354) may be connected to a ballast tank (344), which is then connected via a connection pipe (356) to the dense fluid inlet port (350). The discharge port (358) on the exemplary reactor (326) is connected to a bottom port (360) on the dense fluid separation tank (342) via a high pressure drain pipe (362). Finally, to complete the pressure control circuit, a top port (364) on the supercritical fluid tank (338) is connected to a top port (366) on the dense fluid tank (340) via a inert gas vapor connection pipe (368), and a top port (366) on the dense fluid tank (340) is connected to a top port (370) of the dense fluid separation tank (342) via a vapor return pipe (372).

Various check valves are used to insure that liquid and vapors flow in pre-defined directions to and from each tank and between the tanks and the reactor. A check valve (374) on the supercritical tank vapor transfer pipe (348) insures that vapor exchanges from the supercritical fluid tank to the supercritical atmosphere inlet (346) on the reactor. A check valve (376) on the supercritical vapor transfer line (368) insures that vapor flows from the supercritical fluid tank (338) and into the top of the dense fluid tank (340). A check valve (378) on the dense fluid liquid transfer pipe (354) insures that liquefied gas flows from the bottom of the dense fluid tank (340) to the dense fluid inlet (350) of the reactor (326), or into the ballast tank (344) and finally into the reactor as above. A check valve (380) insures that effluents from the reactor discharge port (358) flow to either the inlet port (360) of dense fluid separation tank (342) via a separation tank valve (382), or to purge or vacuum valves described later. Finally, a check valve (384) on the separation tank vapor transfer pipe (372) insures that vapor flows to the top of the dense fluid tank (340).

Various valves are used to connect the various holding tanks to the atmosphere, the reactor, drains, vents, and vacuum pump subsystems. The dense fluid tank contains two drain valves; a vapor drain valve (384) and a liquid drain valve (388). The inlet ports to the reactor (326) contains two valves; a supercritical fluid anti-solvent inlet valve (390) and a dense fluid solvent inlet valve (392). The reactor (326) contains three outlet valves; a vacuum pump valve (394), a vent valve (396) and a separation tank valve (382). The separation tank also contains a separated waste discharge valve (398).

Various liquid and vapor treatments may be performed to purify the liquids and supercritical fluids and gases. For example, membrane filters are used to remove small particles entrained in various fluid streams transferred between the holding tanks and the dense fluid reactor. These include a dense fluid filter (400), supercritical fluid inlet filter (402), and vapor return filter (404). Vapor treatment modules, increasing adsorbent or other techniques may be used to remove volatile and non-volatile contaminants and water from the liquids and gases. These include a vapor treatment system (406) on the supercritical fluid delivery pipe (348) and a vapor treatment system on the recovered supercritical fluid pipe (372).

A supply of pure dense fluid and supercritical fluid is required to provide an initial charge for processing. Dense fluid and dense gas supply tanks are connected to the holding tanks to create and maintain the proper volume of liquid carbon dioxide, for example. A pure liquid carbon dioxide supply (410) with a pump (412) are connected to the dense fluid supply tank (340) via a connection pipe (414). An optical sensor located on the dense fluid tank (340), which is connected electrically (418) to a pilot switch on the filling pump (412), maintains a pre-determined level within the tank (340). A supply of pure nitrogen, argon or other suitable source gas (420) with a gas booster pump (422) is connected to the supercritical fluid holding tank (338) via a supply connection pipe (424).

Finally, a dense fluid liquid pump (426) is used to compress liquid state dense fluids from the dense fluid tank (340) to a pre-determined pressure and into the reactor (326) or into the ballast tank (344). The ballast tank (344) may be heated to change the phase of the compressed liquid to supercritical fluid solvent phase prior to injection into the reactor (326). Moreover, the ballast tank (344), shown schematically with a mixer apparatus (428), is suitable for blending additives and agents into the dense fluid solvent prior to delivery to the reactor (326). A vacuum pump (430) is used to produce subatmospheric conditions for performing cold plasma treatment operations herein. Finally, a vapor heater (432) is used to heat supercritical fluid anti-solvent to a pre-determined temperature prior to injection into the reactor (326).

The exemplary dense fluid management system as described above using FIG. 12 can be used to produce and maintain isobaric fluid conditions and reactor zone establishment necessary for performing various aspects of the present invention.

Figure 13A:
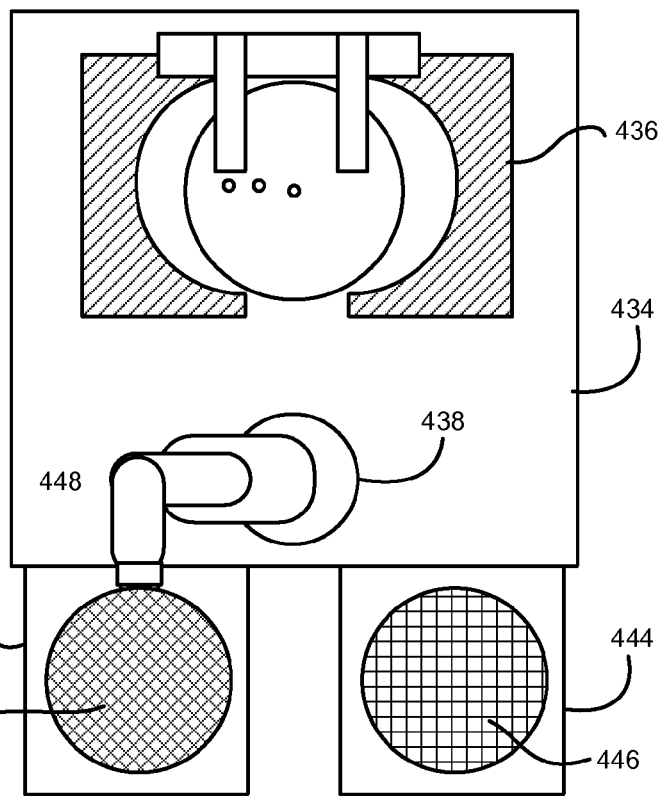
FIGS. 13a, 13b, 13c and 13d—Exemplary schematic of operation of a Class 10 robotic pick-and-place system with FOUP load and unload modules for practicing the present invention using a single dense fluid spin processor reactor.
Figure 13B:
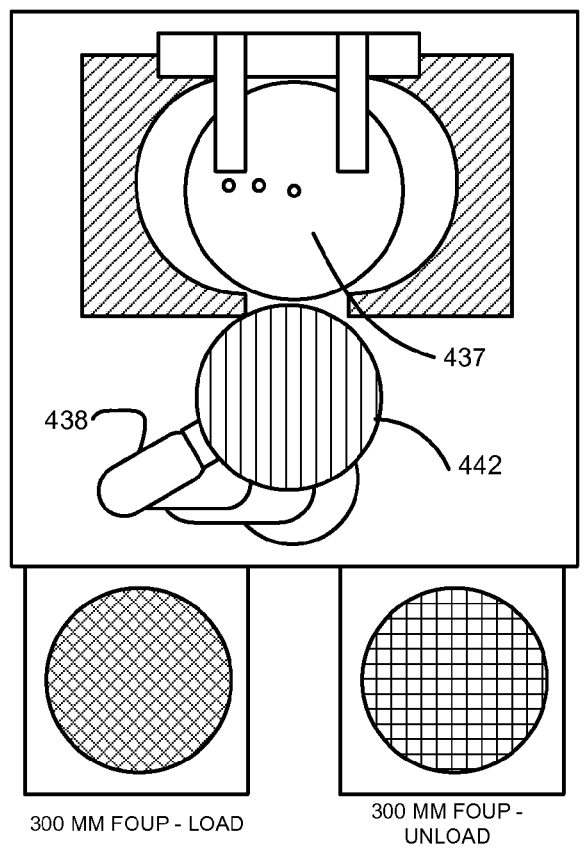
Figure 13C:
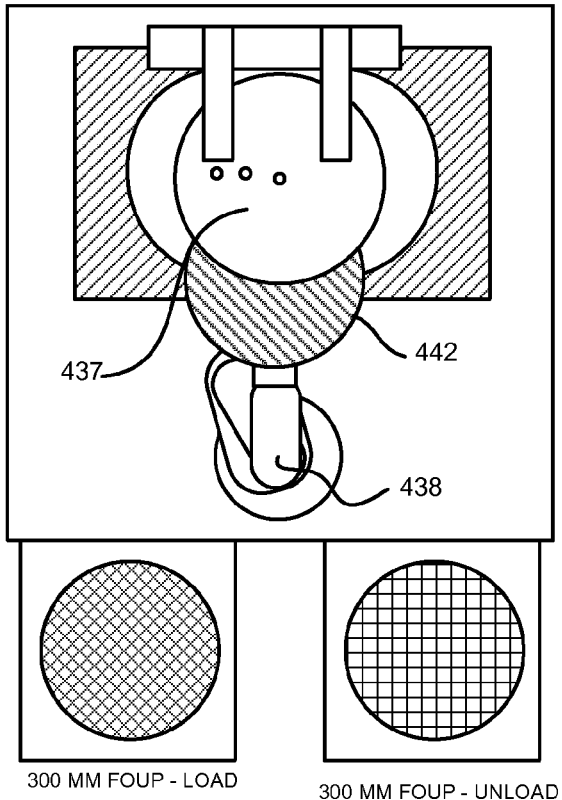
Figure 13D:
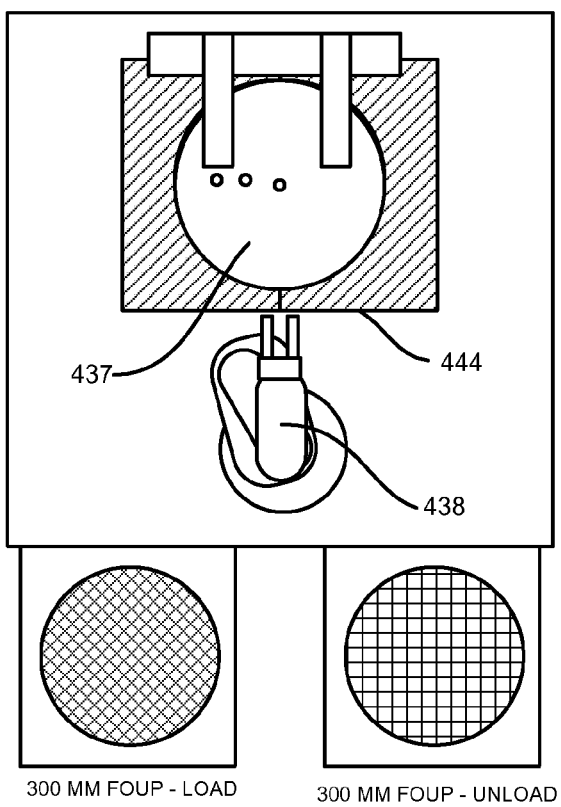

FIGS. 13a, 13b, 13c and 13d are top views of a schematic representation of the operation of an integrated and robotic surface treatment system using the present invention. Referring to FIG. 13a, the exemplary robotic processing system comprises a Fed. Std. 209 Class 100 workstation (434) which contains the dense fluid reactor (436) and a wafer transfer robot (438). Attached to the front of the workstation is a front opening universal pod (FOUP) load station (440) containing un-processed wafer substrates (442) and a FOUP unload station (444) containing processed wafer substrates (446). Referring to FIG. 13a, the exemplary robot (428), using an appropriate pick-up tool (448), picks up an un-processed wafer from the load FOUP station (440). Referring to FIG. 13b, the robot (438) transfers the unprocessed wafer (442) to the front of the dense fluid reactor closure (437). Referring to FIG. 13c, the robot (438) inserts the un-processed wafer substrate (442) into the exemplary mounting fixture (not shown here) as shown in FIG. 11a, (300) located within the closure (437). Referring to FIG. 13d, the robot sits the wafer onto the mounting fixture (not shown) within the closure (437), withdraws from the closure and locking ring area, whereupon the locking rings (444) are brought into the locked position as shown. The system is now ready to process the loaded wafer substrate. Upon completion of the process, the reverse of the above procedure is performed with the processed wafer substrates being off loaded into the unload FOUP.

Figure 14:
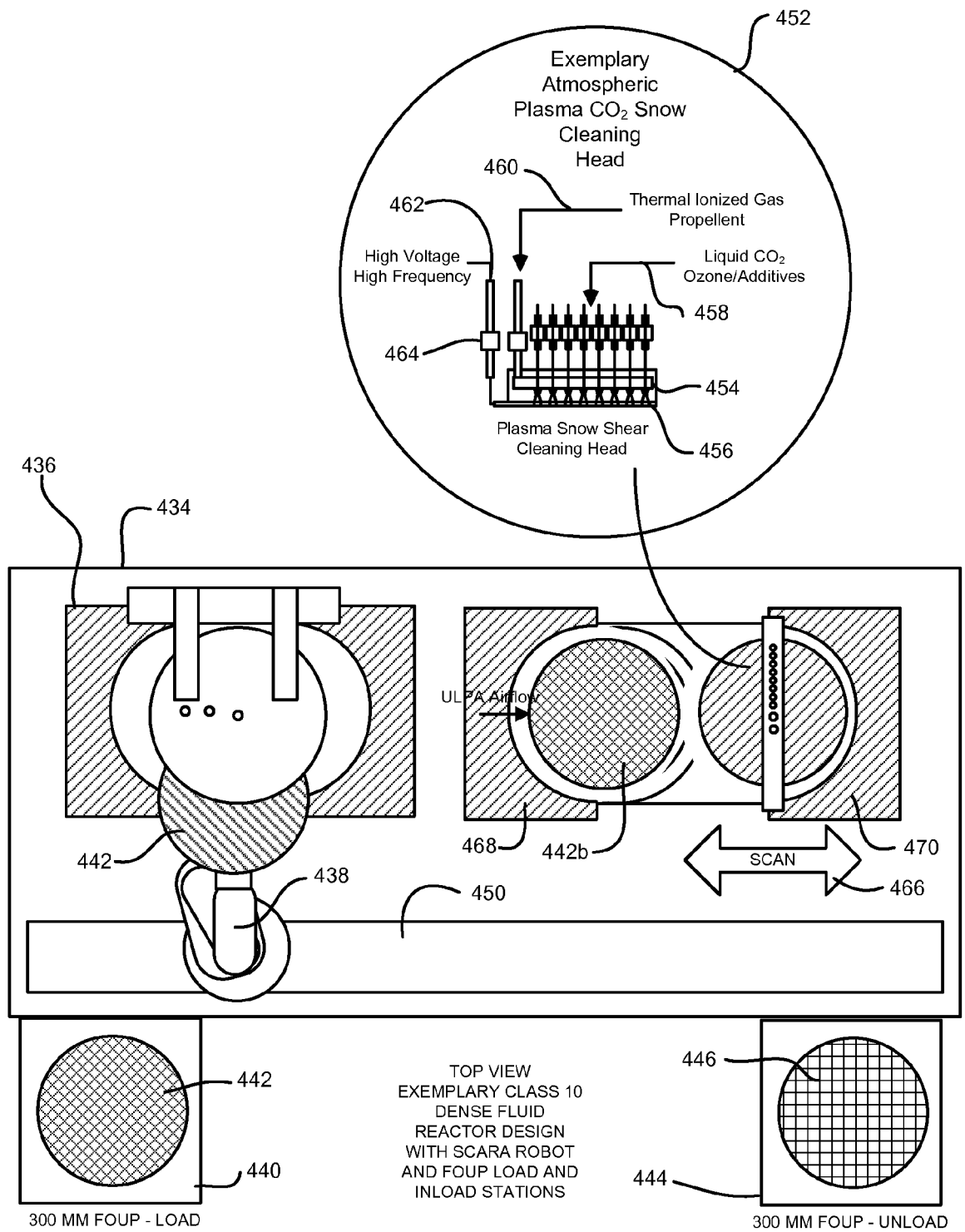
FIG. 14—Exemplary schematic of a Class 10 robotic pick-and-place systems with FOUP load and unload modules for practicing the present invention using a dense fluid spin processor reactor followed by an exemplary atmospheric plasma snow spray particle cleaning module.

FIG. 14 shows another exemplary dense fluid substrate treatment system incorporating a second wafer processing tool incorporating a solid carbon dioxide spray tool—representing for example a combination of immersion drying and cleaning (gross clean) and submicron particle removal (precision clean). The exemplary robotic processing system comprises a Fed. Std. 209 Class 100 workstation (434) which contains the dense fluid reactor (436) and a wafer transfer robot (438) on a robotic track system (450). Attached to the front of the workstation is a front opening universal pod (FOUP) load station (440) containing un-processed wafer substrates (442) and a FOUP unload station (444) containing processed wafer substrates (446). In this exemplary substrate cleaning tool configuration, the un-processed wafer substrate (442) is first processed using one or more of the exemplary cleaning, surface modification, precision drying or deposition processes herein within a first reactor (436). The substrate loading procedure using this novel tool is identical to the tool loading procedure of FIG. 13a-d above. However, following processing in the reactor (436), the robot off-loads the processed wafer to a second tool, in this case a novel solid carbon dioxide spray plasma cleaning tool (452) to perform high pressure CO2 snow spray cleaning as well as surface plasma treatment as a final particle clean. This may be done as a separate operation to increase throughput of a dense fluid cleaning tool.

The exemplary plasma snow cleaning device (452) comprises one or more dielectric solid spray cleaning nozzles (454) which are aligned transverse and in communication with an atmospheric plasma treatment electrode (456). Similar to the exemplary and perforated dense fluid showerhead reactor herein and described in FIG. 9, however this exemplary dense fluid spray plasma spray head contains a linear array or bank of solid spray nozzles as shown which are constructed from non-conductive materials such as PEEK tubing and fittings. Moreover, the exemplary dense fluid spray head comprises a patented and patents-pending solid carbon dioxide spray technique (i.e., U.S. Pat. No. 5,725,154) which combines condensed liquid carbon dioxide and additives (458) and an inert ionized and heated propellant gas phase (460) to form a variable geometry spray when mixed in a suitable nozzle (454). A power source is connected (462) to the plasma electrode (456) using a connector (464). Thus the present design shows the exemplary spray nozzles (454) being machined into the solid body of a plasma electrode (456) to form a plasma snow spray cleaning tool which may be developed into any geometric shape, such as for example a rectangular or a circular treatment tool. Thus the combinational plasma snow spray cleaning head may be formed to treat any type of substrate. FIG. 14 shows an exemplary spin processor cleaning tool wherein the plasma snow cleaning head (452) is scanned (466) in a back and forth direction over, and at a pre-determined distance from and angle to, an exemplary wafer substrate (442b) which is being rotated at between 10 and 5000 rpm by a vacuum spin processor (below and not shown). An exemplary ULPA-filtered gas manifold (468) flows clean inert filtered and possibly heated atmosphere over the substrate (442b) being treated while the exemplary plasma snow treatment head (452) is moved over the substrate (442b). Moreover the exemplary spray head (452) is integrated into a return manifold (470) which is an airflow return for the clean air emanating from the clean air manifold (468). As such, a laminar airflow may be produced over the substrate being treated in accordance with the present invention. Moreover, this atmosphere may be composed from clean dry air, argon, oxygen, nitrogen, and carbon dioxide and mixtures thereof. Still moreover, plasma treatment gases may be employed as described in exemplary plasma treatments discussed herein. Finally, the exemplary plasma snow treatment tool may be used in combination with a deposition, patterning, reactive ion etch, post-etch residue removal described herein as well as many other substrate treatment processes.

Following the second operation, the precision cleaned wafer substrate (446) is un-loaded into the unload FOUP (444). Virtually any configuration of wet and dry substrate treatment tools may be developed and integrated with the present invention to provide for example multiple-clean tools, clean-with-inspection tools, acid etching-drying-cleaning tools, and many other combinations.

Figure 15:
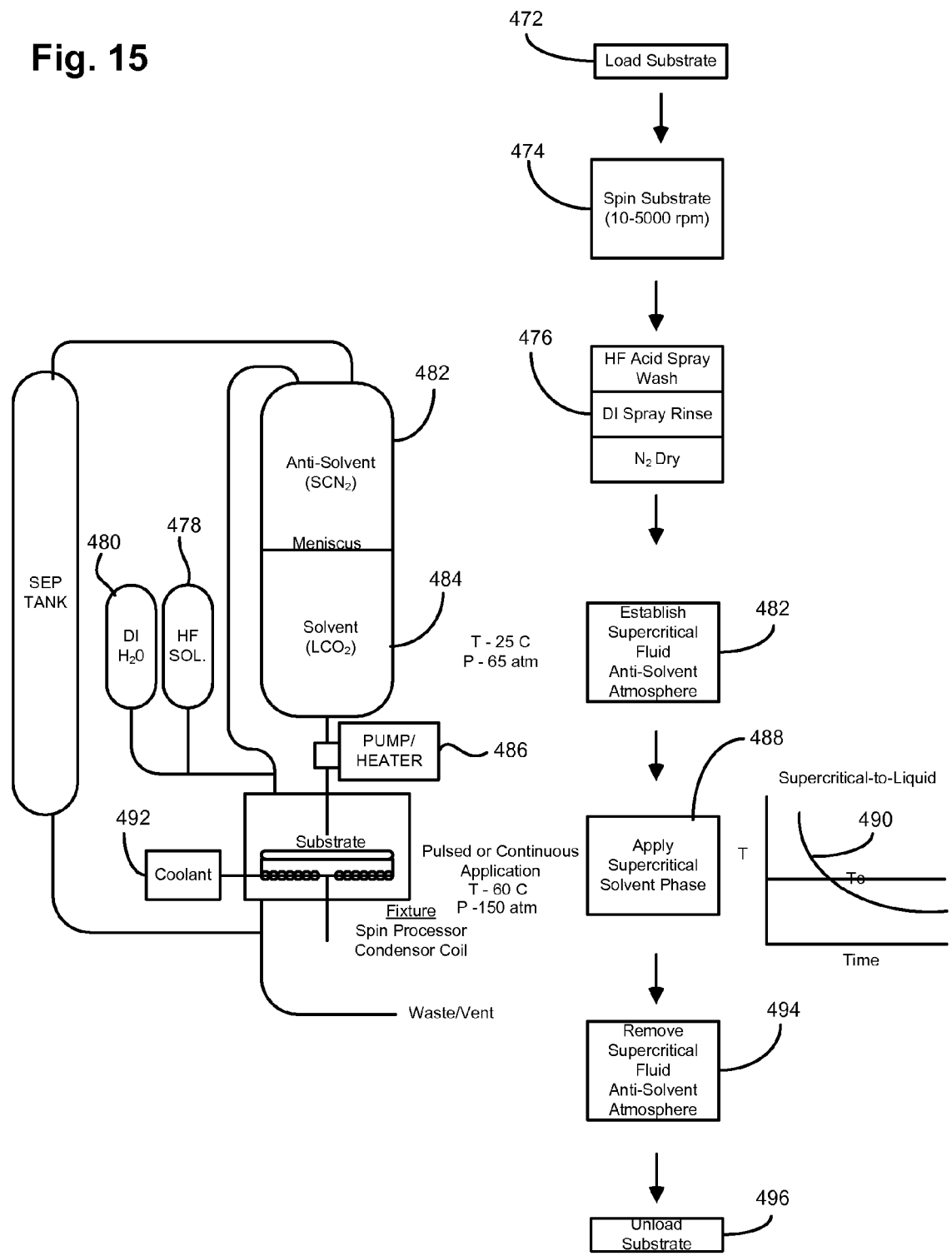
FIG. 15—Exemplary cleaning method combining a wet acid treatment followed by a dense fluid dry and clean.
Figure 16:
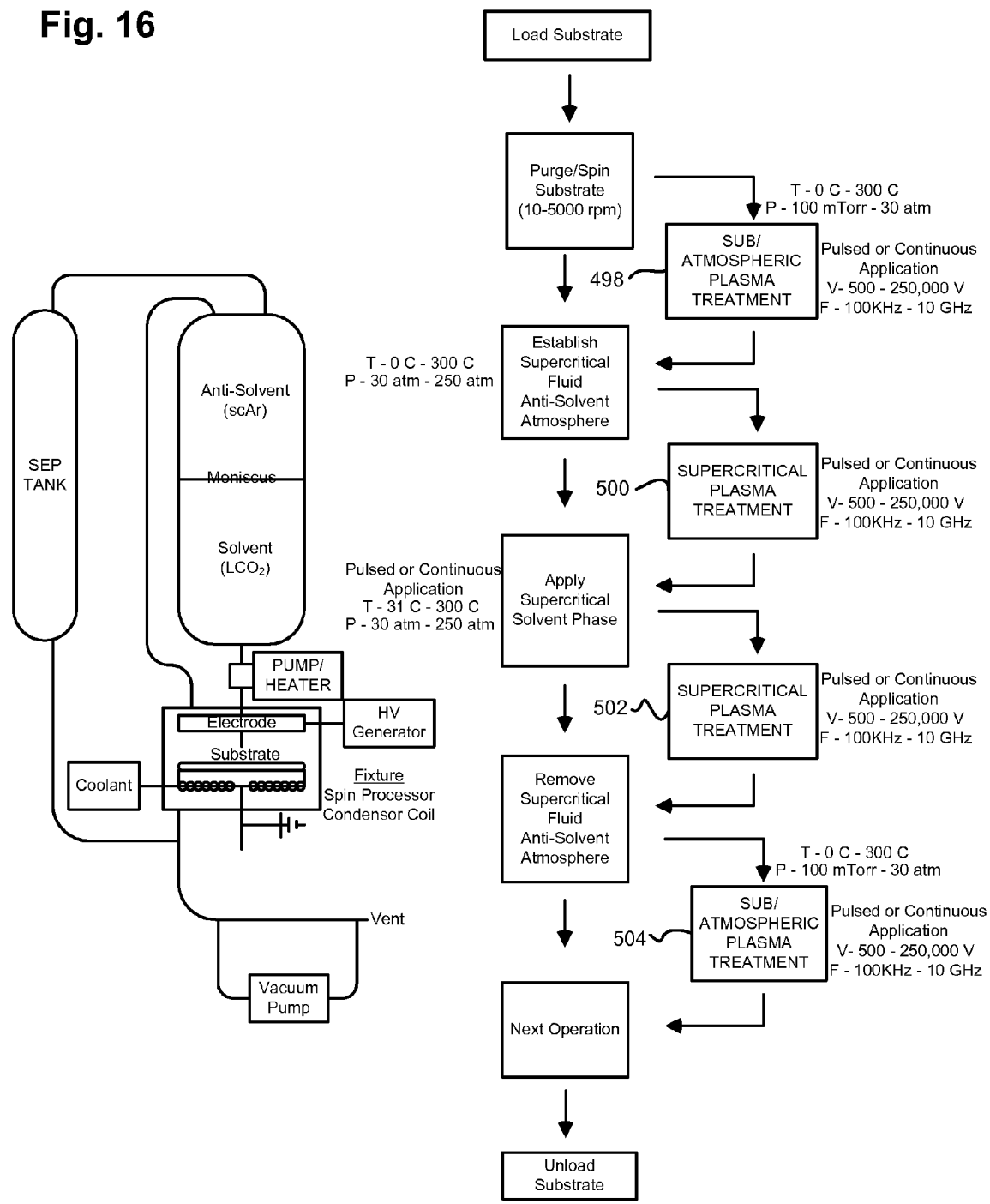
FIG. 16—Exemplary cleaning method combining a condensation shear cleaning with various in-between plasma treatments.

FIG. 15 and FIG. 16 are flow diagrams for additional exemplary methods with a schematic of the exemplary apparatus for performing said method.

As shown in FIG. 15, a substrate is loaded (472) into the exemplary reactor, in this instance a spin processing reactor as described in FIG. 11a-d herein, whereupon the substrate is rotated (474) at a velocity of between 10 rpm and 5000 rpm. A conventional wet acid spray treatment (476) is applied to the substrate consisting of an application of hydrofluoric acid solution (478), deionized water rinses (480), followed by a gross dry using nitrogen (482), which is the anti-solvent supply in this example. Following the gross nitrogen drying sequence, the exemplary reactor of FIG. 11a-d is pressurized to 65 atm and controlled at a temperature of 25 C to establish a first supercritical nitrogen anti-solvent environment (482). Following this, liquid carbon dioxide is withdrawn from a dense fluid tank (484), and using a pump and heater (486), a small but pre-determined amount of liquid carbon dioxide is compressed to supercritical carbon dioxide at a pressure of 150 atm and 60 C and applied (488) in a pulsed (intermittent) or continuous spray to a substrate which initiates the condensation shear cleaning process described herein and shown in the isobar (490). The process continues until the substrate temperature rises to or above the critical temperature of the dense fluid. Alternatively, the condensation shear process may be controlled using a coolant (492) to operate continuously with each injection of, or a continuous application, of supercritical carbon dioxide. During application of each aliquot of supercritical carbon dioxide, an internal cooling coil condenses the spent cleaning agent which is withdrawn immediately from the reactor using the isobaric dense fluid management system design of FIG. 12. Following the condensation shear cleaning step, the supercritical fluid anti-solvent environment is withdrawn (494) and vented to the atmosphere. At this point the substrate is warm and dry because a heated supercritical anti-solvent is bathing the substrate, using the vapor heater of FIG. 12, (432), as the reactor pressure is reduced to ambient conditions. Alternatively, the substrate may be bathed in heated ionized nitrogen to neutralize any residual electrostatic charges accumulated during processing. Finally, the clean, dry and neutralized substrate is unloaded (496) from the reactor.

FIG. 16 is very similar to the method described in FIG. 15 but without a conventional wet processing and gross drying pre-treatment step. The method shown in FIG. 16 teaches the option of 1) establishing a sub-atmospheric or atmospheric plasma (498) prior to or while establishing a supercritical anti-solvent environment within a reactor; 2) establishing a super-atmospheric plasma (500) prior to or while establishing a dense fluid solvent cleaning agent within a reactor; 3) establishing a super-atmospheric plasma (502) prior to or while removing first supercritical fluid anti-solvent from a reactor; and 4) establishing a sub-atmospheric or atmospheric plasma (504) prior to the next process step. Thus as depicted in FIG. 16, plasma steps may augment the condensation shear cleaning and deposition steps at various steps and for various purposes to formulate and execute a variety of surface treatment recipes.

EXAMPLES OF USE

Following are example applications for the present invention.

Example 1

Precision cleaning a semiconductor wafer to remove sub-micron particles from microscopic structures using a condensing flow of supercritical carbon dioxide.

Example 2

Precision drying a semiconductor silicone device containing optical switches to remove trace moisture and residues from microscopic interfaces using a plasma and liquid carbon dioxide spray.

Example 3

Precision cleaning a silicon semiconductor wafer containing integrated circuits to remove post-plasma reactive ion etch residues (carbon-fluorine compounds) from sidewalls of microscopic vias using combinations of argon-oxygen plasma and a condensing spray of supercritical carbon dioxide.

Example 4

Deposition of an organometallic coating on a silicon substrate, heating said coated substrate and exposing same to a supercritical atmosphere of argon and hydrogen reducing atmosphere.

Example 5

Extracting a polydimethylsilicone implantable device in a tumbling drum reactor to remove unreacted monomers from subsurface pores and simultaneously plasma treating substrate surfaces to destroy biological contaminants and to increase substrate surface energy for adhesive bonding.

Example 6

Deposition of an organic coating on a silicon substrate, softbaking said film, and exposing said film to a plasma.

Example 7

Precision drying a semiconductor silicone device containing integrated circuits using a condensing supercritical carbon dioxide spray containing methanol.

Example 8

Precision cleaning of a thin semiconductor wafer using atmospheric plasma and dense fluids.

Example 9

Atmospheric plasma etching of a low-k photoresist layer followed by supercritical fluid drying and cleaning (extraction).

Example 10

Precision cleaning a wafer surface and plasma-enhance chemical vapor deposition (PECVD) of silicon dioxide from tetraethoxysilane (TEOS).

Example 11

Precision cleaning a CMOS image sensor and gold wire bonds using a combination of atmospheric plasma and solid phase carbon dioxide spray treatment.

Although the present invention has been described with reference to preferred embodiments, workers skilled in the art will recognize that changes may be made in form and detail without departing from the spirit and scope of the invention.

The invention claimed is:

1. A method of treating a substrate containing a contaminant comprising the sequential steps of:
   positioning the substrate within a vessel;
   pretreating the substrate to at least partially remove the contaminant;
   pressurizing the vessel;
   introducing a liquid or supercritical phase solvent into the vessel;
   contacting the liquid or supercritical phase solvent with the substrate for a first selected period of time to further at least partially remove the contaminant from the substrate;
   depressurizing the vessel to transition the liquid or supercritical phase solvent into a gaseous phase solvent, the depressurization occurring without subjecting the substrate to the atmosphere;
   subjecting the vessel to an electric field to transition the gaseous phase solvent into a plasma phase solvent; and
   contacting the plasma phase solvent with the substrate for a second selected period of time to further treat the substrate.

2. The method of claim 1 wherein pretreating the substrate comprises the sequential steps of:
   pressurizing the vessel;
   introducing a supercritical phase anti-solvent into the vessel and contacting the substrate with the anti-solvent;
   introducing a pretreatment solvent into the pressurized vessel and contacting the substrate with the pretreatment solvent to at least partially remove the contaminant from the substrate and into the pretreatment solvent;
   removing the pretreatment solvent containing the at least partially removed contaminant from the vessel; and
   depressurizing the vessel to remove the anti-solvent from the substrate.

3. The method of claim 2 wherein the anti-solvent includes nitrogen, argon, helium or oxygen.

4. The method of claim 2 wherein the pretreatment solvent includes carbon dioxide, nitrous oxide, ammonia, fluorocarbons, xenon or sulfur hexafluoride.

5. The method of claim 2 wherein the pretreatment solvent includes either liquid phase solvent or supercritical phase solvent.

6. The method of claim 1 wherein the vessel is pressurized to a pressure between about 850 psi and about 1500 psi.

7. The method of claim 1 wherein the vessel is depressurized to form a vacuum.

8. The method of claim 7 wherein the vessel is depressurized to a pressure between about 150 mTorr and 300 mTorr.

9. The method of claim 1 wherein the plasma phase solvent is between about 15 degrees Celsius and about 60 degrees Celsius.

10. The method of claim 1 wherein the liquid or supercritical phase solvent includes carbon dioxide.

* * * * *